United States Patent [19]
Matsuyama et al.

[11] Patent Number: 5,716,480
[45] Date of Patent: Feb. 10, 1998

[54] PHOTOVOLTAIC DEVICE AND METHOD OF MANUFACTURING THE SAME

[75] Inventors: Jinsho Matsuyama, Kyoto; Ryo Hayashi, Tsukuba, both of Japan

[73] Assignee: Canon Kabushiki Kaisha, Tokyo, Japan

[21] Appl. No.: 678,701

[22] Filed: Jul. 11, 1996

[30] Foreign Application Priority Data

| Jul. 13, 1995 | [JP] | Japan | 7-177437 |
| Jul. 13, 1995 | [JP] | Japan | 7-177438 |
| Jul. 13, 1995 | [JP] | Japan | 7-177439 |
| Jul. 13, 1995 | [JP] | Japan | 7-177440 |
| Jul. 13, 1995 | [JP] | Japan | 7-177441 |

[51] Int. Cl.$^6$ ............... H01L 31/075; H01L 31/20
[52] U.S. Cl. ............... 136/249; 136/255; 136/258; 257/55; 257/458; 438/96; 438/97
[58] Field of Search ............... 136/249 TJ, 258 AM, 136/258 PC, 255; 437/4, 113; 257/11, 458; 438/96–97

[56] References Cited

U.S. PATENT DOCUMENTS

| 2,949,498 | 8/1960 | Jackson | 136/244 |
| 4,254,429 | 3/1981 | Yamazaki | 257/65 |
| 4,377,723 | 3/1983 | Dalal | 136/249 |
| 4,816,082 | 3/1989 | Guha et al. | 136/249 |
| 5,324,364 | 6/1994 | Matsuda et al. | 136/249 |
| 5,589,007 | 12/1996 | Fujioka et al. | 136/249 |

FOREIGN PATENT DOCUMENTS

| 62-232173 | 10/1987 | Japan | 136/258 AM |
| 63-37675 | 2/1988 | Japan | 136/258 AM |
| 1-278782 | 11/1989 | Japan | 136/258 AM |
| 4-61385 | 2/1992 | Japan | 136/258 AM |
| 4-299576 | 10/1992 | Japan | 136/258 AM |
| 4-333289 | 11/1992 | Japan | 136/258 AM |

OTHER PUBLICATIONS

Y. Hamykawa, "A new type of amorphous silicon photovoltaic cell generating more than 2.0 V", 35 Applied Physics Letters 187 (1979).

*Primary Examiner*—Aaron Weisstuch
*Attorney, Agent, or Firm*—Fitzpatrick, Cella, Harper & Scinto

[57] ABSTRACT

A photovoltaic device having a pin type semiconductor junction in which a p-type semiconductor layer and an n-type semiconductor layer are laminated with an interposed i-type semiconductor layer, comprises at least one doped layer of a non-monocrystal semiconductor disposed under and/or over the i-type semiconductor layer, wherein the at least one doped layer has a surface exposed to a plasma containing a band gap increasing element.

122 Claims, 7 Drawing Sheets

PHOTOVOLTAIC DEVICE AND METHOD OF MANUFACTURING THE SAME

BACKGROUND OF THE INVENTION

1. Field of the Invention

This invention relates to an improved photovoltaic device and a method of manufacturing the same.

2. Related Background Art

There are various means for improving the photoelectric conversion efficiency of a photovoltaic device comprising an amorphous semiconductor. A photovoltaic device comprising, for example, pin type semiconductor junctions requires the improvement of the characteristics of the p-, i-, and n-type semiconductor layers and transparent and back electrodes constituting the photovoltaic device in order to improve its photoelectric conversion efficiency.

Another method for improving the conversion efficiency of a photovoltaic device wherein a stacked cell construction is used to laminate a plurality of photovoltaic devices and use them as unit device structures has been disclosed in U.S. Pat. No. 2,949,498 and Y. Hayakawa et al. "Applied Physics Letters 35" (1979), 187.

The use of a buffer layer to maintain the band width inclination at the interface between a p- and/or n-type semiconductor and an i-type semiconductor layer has been disclosed in U.S. Pat. No. 4,254,429 and U.S. Pat. No. 4,377,723. This buffer layer is used to eliminate a large number of energy levels that are generated in the interface between a p- or n-type semiconductor made of amorphous silicon and an i-type semiconductor made of amorphous silicon germanium, due to the difference in the lattice constants of these layers, thereby improving the junction and increasing the open circuit voltage ($V_{OC}$) while preventing the transport properties of change carriers from being degraded.

Another method employs a varying bandwidth layer wherein the i-type semiconductor layer comprises, for example, amorphous silicon germanium with the composition ratio of silicon and germanium varied within the intrinsic layer to improve the characteristics. For example, U.S. Pat. No. 4,816,082 discloses a method of widening the band gap in that part of the i layer which contacts a first valence-electron-controlled semiconductor layer on the light incidence side, gradually narrowing the band gap toward the middle, and gradually widening the band gap toward a second valence-electron-controlled semiconductor layer. This method enables charge carriers generated by light to be efficiently separated due to internal electric fields, thereby improving the photoelectric conversion efficiency.

Furthermore, since an i-type semiconductor layer comprising amorphous silicon or amorphous silicon germanium exhibits somewhat the characteristics of the n-type, a small amount of p-type valence electron control agent is mixed into the i-type layer to improve the transport properties of holes.

A doped layer such as a p- or n-type semiconductor layer requires a lower activation energy due to the high concentration of activated acceptors or donors. Such characteristics serve to increase the diffusion potential (built-in potential) of the pin junction and the open circuit voltage ($V_{OC}$) of the photovoltaic device, thereby improving the photoelectric conversion efficiency.

In addition, the doped layer is required to minimize its absorption of light incident on the i-type semiconductor layer which is used to generate the photoelectric current. It is thus important to widen the optical band gap and to reduce the thickness of the doped layer.

It is also necessary to form a homo or hetero pin junction between the doped layer and the i-type semiconductor layer to reduce energy levels at the interface.

Doped layer materials with such characteristics and methods for forming them have been extensively studied.

Materials for the doped layer include Si, SiC, SiN and SiO, and amorphous or microcrystal forms of such materials have been studied. As for formation methods thereof, RF plasma CVD, ECR plasma CVD, and photo CVD have been researched.

Among these known materials for the doped layer, amorphous silicon (a-Si) is widely used as a doped layer at the rear of the i-type semiconductor layer relative to the light incident side because it is easy to form, and amorphous silicon carbide (a-SiC) and microcrystal silicon (μc-Si) are used as a doped layer on the light incident side of the i-type semiconductor layer due to their small absorption coefficient and low activation energy, respectively.

The microcrystal doped layer generally has a smaller absorption coefficient, a larger optical band gap, and a lower activation energy than the amorphous doped layer, so this material is assumed to be desirable as the doped layer.

It is, however, difficult to form a microcrystal material that can provide a high concentration of activated acceptors and donors and which has a low activation energy. Few proposed materials, other than microcrystal Si, have large open circuit voltages and a high photoelectric conversion efficiency, and such materials must be further improved so as to be put into practical use. In addition, if a microcrystal or polycrystal doped layer is deposited on an amorphous i-type semiconductor layer, and in particular, the i-type semiconductor layer and the doped layer are hetero-joined, then there will be a large number of interfacial energy levels, adversely affecting the pin junction.

In addition, the use of the above material as a doped layer results in an increase in the difference in the composition and lattice constant of the i-type semiconductor and doped layers, thereby increasing the number of energy levels in the interface between the i-type semiconductor layer and the doped layer. It also becomes difficult to form a buffer layer between the i-type semiconductor layer and the doped layer to reduce interfacial energy levels. That is, although the composition and lattice constant of the buffer layer desirably gradually varies within the layer to connect the differences in the composition and lattice constant of the i-type semiconductor layer and the doped layer, the film quality of the buffer layer becomes more and more degraded as the differences in the composition and lattice constant of the i-type semiconductor layer and the doped layer become larger. With a buffer layer having bad film quality, the open circuit voltage ($V_{OC}$) or fill factor (F.F.) of the photovoltaic device cannot be improved.

SUMMARY OF THE INVENTION (1) A first aspect of this invention provides a photovoltaic device comprising a pin-type semiconductor junction formed by laminating a p-, i-, and n-type semiconductor layers with part of the junction comprising an amorphous semiconductor, wherein the surface of a doped layer located above or below the i-type semiconductor layer is exposed to plasma containing an element that increases its band gap. This enables the formation of a doped layer that has a high concentration of activated acceptors or donors and which requires low activation energy, the doped layer also having a large optical band gap and a small absorption coefficient. This also reduces the amount of light absorbed by the doped layer, and increases the built-in potential of the photovoltaic device, thereby increasing the open circuit voltage ($V_{OC}$) and the short-circuit current ($J_{SC}$) to improve the photoelectric conversion efficiency.

(2) According to a second aspect of this invention, a valence electron controlling agent of the same type as the doped layer can be contained in the a plasma to further enhance the above effect.

(3) According to a third aspect of this invention, a buffer layer is disposed over the i-type semiconductor layer and the surface of the buffer layer is exposed to a plasma containing a band gap increasing element to reduce the difference in the composition and lattice constant of the i-type semiconductor layer and the doped layer to reduce the interfacial energy levels between the i-type semiconductor layer and the doped layer, thereby increasing the built-in potential, open circuit voltage ($V_{OC}$), and fill factor (F.F.) of the photovoltaic device to improve the photoelectric conversion efficiency.

(4) According to another aspect of this invention, two or more layers of the pin type semiconductor junction having a plasma-processed doped layer and/or buffer layer are laminated to increase the open circuit voltage ($V_{OC}$) of the whole photovoltaic device and to reduce the amount of light absorbed by the doped layer, thereby increasing the short-circuit current ($J_{SC}$) to improve the photoelectric conversion efficiency. In addition, if plasma processing is applied to a doped layer disposed over a tunnel junction in a stacked-type photovoltaic device, the counter diffusion of the valence electron control agent in the tunnel junction is reduced to increase the open circuit voltage ($V_{OC}$) and fill factor (F.F.) of the photovoltaic device to improve the photoelectric conversion efficiency.

(5) In the doped and/or buffer layer, the composition ratio of the band cap increasing element is varied in the direction of its film thickness, thereby further increasing the built-in potential and open circuit voltage ($V_{OC}$) of the photovoltaic device to improve the photoelectric conversion efficiency.

(6) Part of the doped and/or buffer layer is microcrystallized or polycrystallized in the direction of its film thickness to further increase the built-in potential and open circuit voltage ($V_{OC}$) of the photovoltaic device and to reduce the amount of light absorbed by the doped layer to increase the shortcircuit current ($J_{SC}$), thereby improving the photoelectric conversion efficiency.

(7) It is another advantage of this invention that a large doped and/or buffer layer can be uniformly formed so as to uniformly form a large photovoltaic device. Since the doped layer has a small film thickness, the distribution of its film thickness or characteristics over its large area affects the distribution of the characteristics of the photovoltaic device over its large area. This invention, however, can uniformize the distribution of the film thickness or characteristics of the doped layer to correspondingly uniformize the distribution of the characteristics of the photovoltaic device.

(8) In addition, this invention can eliminate the need for production of ions of large energy when the doped and/or buffer layer is deposited, and employ plasma processing to reduce the stress inside the doped layer, thereby improving the adhesion of the doped layer to its surface layer to increase the yield of the photovoltaic device.

It is not clear why this invention produces the above advantages, but the following assumptions are possible.

By exposing the surface of the doped and/or buffer layer to plasma containing a band gap increasing element, this element is injected into the doped layer to increase the optical band gap.

Compared to methods for depositing a doped and/or buffer layer in which a gas containing a band gap increasing element is used as part of a mixed raw material gas, and decomposed to form a doped and/or buffer layer with a larger optical band gap, the above method can form a doped and/or buffer layer that has higher conductivity and which requires lower activation energy, without changing the band gap. This can be assumed to be due to the following reason.

If a doped and/or buffer layer with a desired optical band gap is formed through deposition, it generally becomes more and more difficult to obtain a layer that has high conductivity and which requires low activation energy as the optical band gap is increased. This is probably because the local energy levels in the doped layer increase according to the increase of the band gap to reduce the concentration of activated donors or acceptors as well as because the dark conductivity in the intrinsic state decreases according to the increase of the band gap to increase the required activation energy. Furthermore, this is partly due to the following reason: a mixture of a raw material gas containing the principal component elements and a raw material gas containing a band gap increasing element must be used as a raw material gas for depositing a doped and/or buffer layer, and the band gap increasing element is likely to be segregated in the film because the decomposition efficiencies of these two types of raw material gases generally differ under the same energy. To solve this problem, the prior art has examined various types of raw material gases for the doped layer and methods for forming films using improved methods for decomposing the raw material gas. Such methods, however, have failed to control manufacturing costs well or damaged the surface of the doped and/or buffer layer.

The method for forming a doped layer according to this invention, however, injects a band gap increasing element after a doped and/or buffer layer is deposited, so an appropriate layer can be formed by simply depositing it under the optimum conditions for producing a film that has high conductivity, low activation energy, and which has few local energy levers. The band gap increasing element is subsequently injected into the doped layer through plasma processing, but such an injection of a band gap increasing element using glow discharge plasma substantially differs from conventional ion implantation processes. Conventional ion implantations accelerate ions into a beam to increase their energy, while glow discharge plasma injections maintain the energy of the injected material at a low level, which causes injection down to only a very shallow region of the processed layer.

Thus, the injected ions do not damage the processed layer. In addition, this method does not require the use of the same energy to diffuse two types of raw material gases as in deposition methods, so the optimum processing conditions can be found easily, and the band gap increasing element is unlikely to be segregated in the film. Consequently, a doped and/or buffer layer with few local energy levels and a large optical band gap can be formed without degrading the film quality.

Although an improvement of the deposition apparatus is required to decompose the two types of raw material gases so as to uniformly deposit a doped and/or buffer layer over a large area, this invention enables the easy fine-tuning of the depth of optical band gap increasing element when injected into the doped layer, thereby allowing the element to be uniformly injected over a large area.

When a doped and/or buffer layer with a large optical band gap or a doped and/or buffer layer comprising microcrystals or polycrystals is deposited, the need to increase the energy of the ions may cause the underlying layer to be damaged. This invention, however, does not require the ions to have a large energy during deposition, preventing the underlying layer from being damaged. In particular, if plasma processing is applied to a doped layer disposed over a tunnel junction in a stacked-type photovoltaic device, the underlying layer of the doped layer, that is, the doped layer below the tunnel junction is prevented from being damaged, thereby reducing the counter diffusion of impurities in the tunnel junction and increasing the open circuit voltage ($V_{OC}$) and fill factor (F.F.) of the photovoltaic device, thereby improving the photoelectric conversion efficiency.

According to this invention, the depth of a band gap increasing element can be fine-tuned easily when they injected into the doped and/or buffer layer, thereby varying the composition ratio of the band gap increasing element and thus the band gap of the doped and/or buffer layer in the film thickness direction. If, for example, the band gap of the doped layer is formed so as to be particularly large near the interface between the doped layer and the i-type semiconductor layer, then the built-in potential increases compared to the case in which the band gap of the doped layer is distributed uniformly in the thickness direction. If the band gap of the buffer layer is formed so as to be particularly large near the doped layer, the band gaps of the doped layer and the i-type semiconductor layer are connected smoothly to reduce the interfacial energy levels to increase the built-in potential of the photovoltaic device, compared to the case in which the band gap in the buffer layer is distributed uniformly in the thickness direction. In addition, the slope of the band gap in the buffer layer serves to reduce the back diffusion of photocarriers to increase the open circuit voltage ($V_{OC}$) and fill factor (F.F.) of the photovoltaic device.

Furthermore, according to this invention, the conditions for plasma processing for injecting a band gap increasing element can be adjusted so as to microcrystalline or polycrystallize the vicinity of the surface of a deposited amorphous doped and/or buffer layer or noncrystalline the vicinity of a deposited microcrystal or polycrystal doped layer.

For example, by microcrystallizing or polycrystallizing the vicinity of the surface of a deposited amorphous doped and/or buffer layer while increasing the band gap, the absorption coefficient of a doped and/or buffer layer is reduced and the short-circuit current ($J_{SC}$) of the photovoltaic device is increased. In addition, microcrystallization or polycrystallization serves to reduce the activation energy of the doped layer and increases the built-in potential of the photovoltaic device, thereby improving the open circuit voltage ($V_{OC}$) and the fill factor (F.F.).

In addition, for example, by noncrystallizing the vicinity of the surface of a deposited microcrystal or polycrystal doped layer while increasing the band gap, the built-in potential of the photovoltaic device is increased. In addition, the interfacial energy levels generated by the contact between the i-type semiconductor layer and the microcrystal or polycrystal doped layer are reduced by the presence of the amorphous doped layer between these layers. Consequently, the open circuit voltage ($V_{OC}$) and fill factor (F.F.) of the photovoltaic device are increased.

In general, if a doped layer comprising a microcrystal or polycrystal semiconductor contacts an i-type semiconductor layer comprising an amorphous semiconductor to form a p/i or n/i interface, energy levels are generated at the p/i or n/i interface. In the above case, however, a doped layer comprising an amorphous semiconductor is present between the doped layer comprising a microcrystal or polycrystal semiconductor and the i-type semiconductor layer comprising an amorphous semiconductor, and interfacial energy levels generated by the contact between the microcrystal or polycrystal semiconductor and the amorphous semiconductor are present at the p/p or n/n interface. Consequently, the adverse effects of the energy levels are significantly reduced, and the built-in potential is increased. The built-in potential is also increased due to the presence of the doped layer comprising an amorphous semiconductor layer with a band gap wider than that of the microcrystal or polycrystal semiconductor, between the doped layer comprising a microcrystal or polycrystal semiconductor and the i-type semiconductor layer comprising an amorphous semiconductor.

Furthermore, the doped layer comprising a microcrystal or polycrystal semiconductor contacts the i-type semiconductor layer comprising an amorphous semiconductor to form a p/i or n/i interface. In the above case, however, since a buffer layer that changes from an amorphous semiconductor to a microcrystal or polycrystal semiconductor is present between the buffer layer comprising a microcrystal or polycrystal semiconductor and the i-type semiconductor layer comprising an amorphous semiconductor, crystallinity gradually varies from the doped layer toward the i-type semiconductor layer, significantly reducing the number of interfacial energy levels generated by the contact between the microcrystal or polycrystal semiconductor and the amorphous semiconductor.

DESCRIPTION OF THE PREFERRED EMBODIMENTS

Figure 1A:
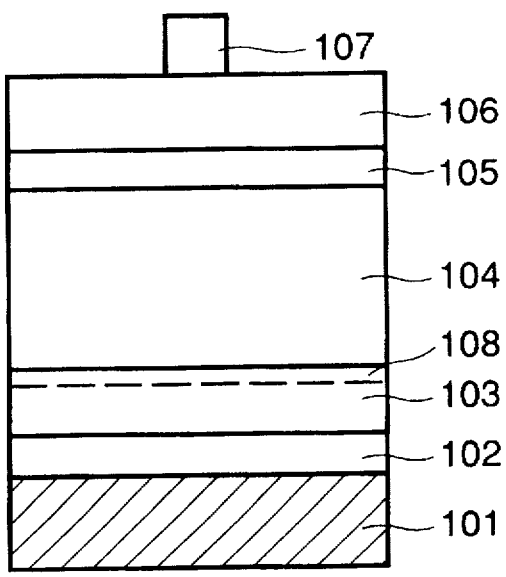
FIGS. 1A to 1C are schematic cross sectional views showing the constitution of the layers of a single-cell type photovoltaic device according to this invention.
Figure 1B:
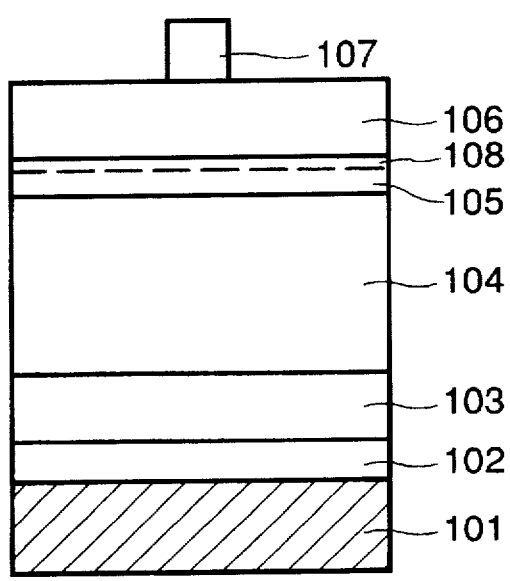
Figure 1C:
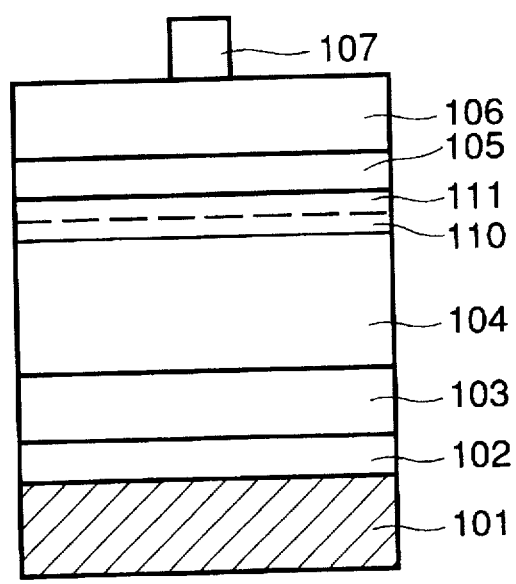
Figure 2A:
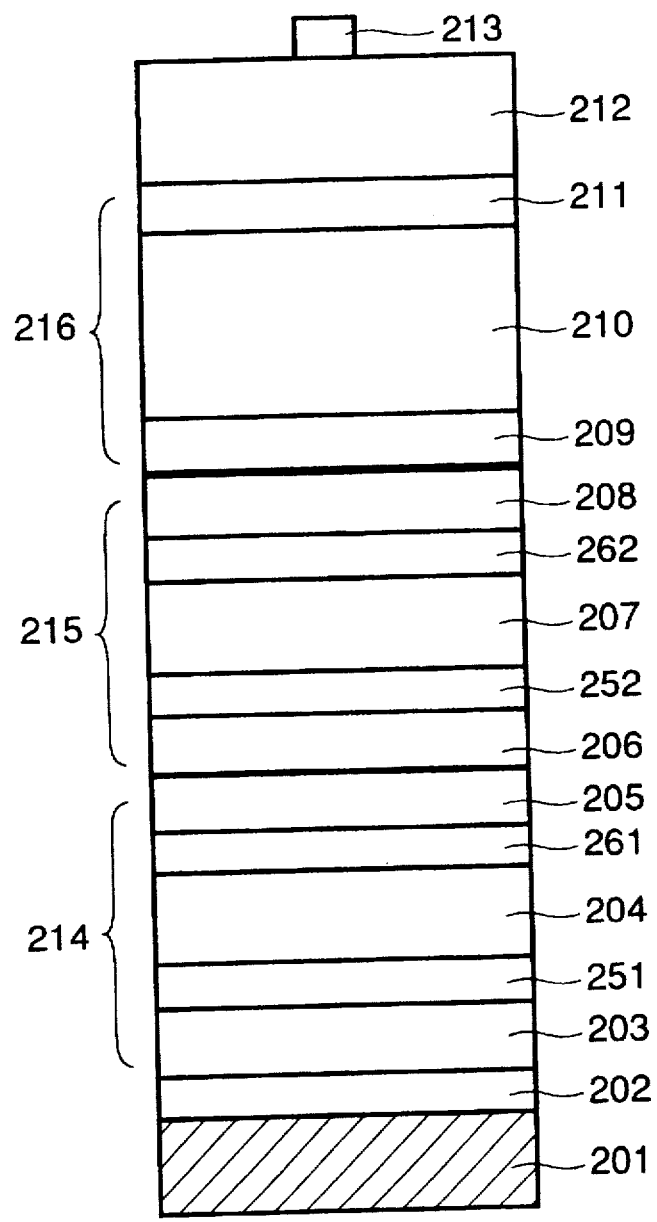
FIGS. 2A and 2B are schematic cross sectional views showing the constitution of the layers of a tandem stacked-cell type photovoltaic device according to this invention.
Figure 2B:
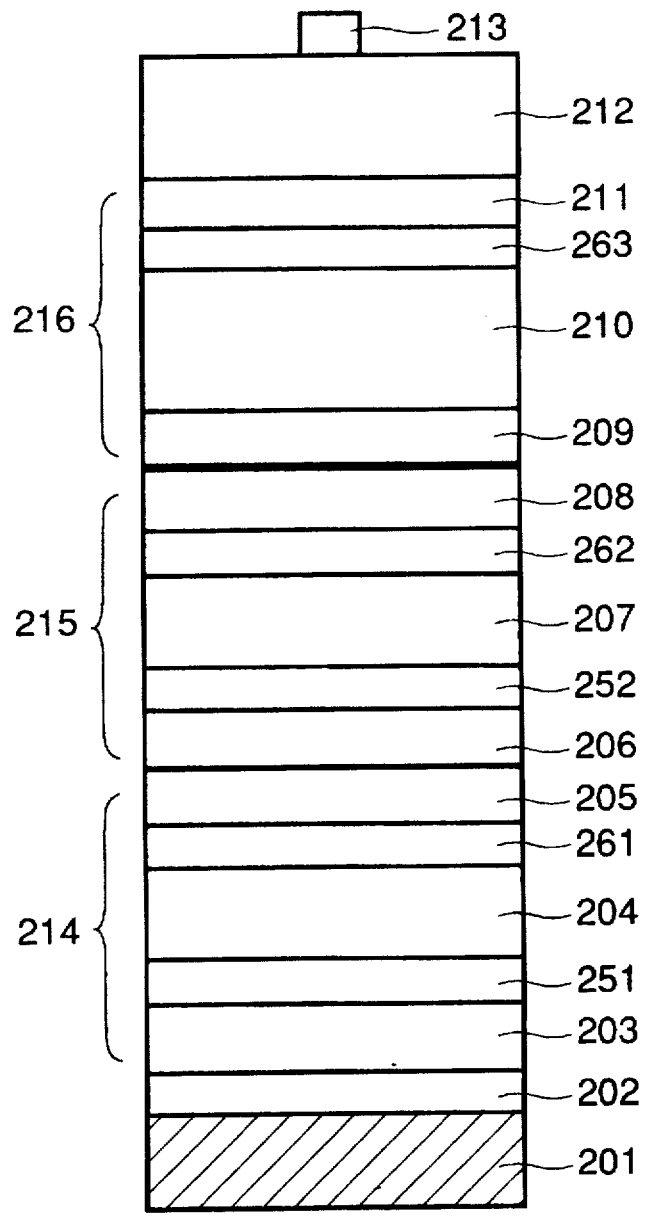

The photovoltaic devices according to this invention include two types: a single cell type shown in FIGS. 1A to 1C and a tandem stacked cell type shown in FIGS. 2A and 2B. The constitution of the photovoltaic devices according to this invention and a method for manufacturing the photovoltaic devices are described below with reference to the drawings.

In FIGS. 1A and 1B, 101 is a substrate, 102 is a back electrode, 103 is an n-type (p-type) semiconductor layer, 104 is an i-type semiconductor layer, 105 is a p-type (n-type) semiconductor layer, 106 is a transparent electrode, and 107 is a current collecting electrode. FIGS. 1A to 1C show a construction in which light enters the device from the side opposite the substrate, but the devices may be constituted so that light enters the device from the substrate side. Reference numeral 108 designates the surface of a doped layer that has been exposed to plasma and which is a feature of this invention.

In FIG. 1C, 110 is a buffer layer, and 111 is the surface of the buffer layer that has been exposed to plasma and which is a feature of this invention. The buffer layer may be disposed in the interface with the underlying layer.

The tandem stacked-cell type photovoltaic devices in FIGS. 2A and 2B have a construction in which three pin junctions are laminated; 216 is the first pin junction relative to the light incident side, 215 is the second pin junction, and 214 is the third pin junction. These three pin junctions are laminated on a back electrode 202 formed on a substrate 201, and a transparent electrode 212 and a current collecting electrode 213 are formed on the top pin junction.

Each pin junction comprises an n-type semiconductor layer 203, 206 or 209, an i-type semiconductor layer 204, 207, or 210, and a p-type semiconductor layer 205, 208, or 211. Reference numerals 251, 252, 261, 262 and 263 are buffer layers. At least one doped and/or buffer layer is subjected to plasma processing according to this invention.

Each of the layers constituting the photovoltaic device according to this invention is described below in detail in the order that they are formed.

Substrate

Materials for the substrate include metals or alloys, a film or sheet of heat-resistant synthetic resin, a composite of one of these materials and glass fibers, carbon fibers, boron fibers, or metallic fibers, such as a metallic or resin sheet, the surface of which is coated with a metallic and/or insulating sheet of a different material using sputtering, vapor deposition, or a plating method. Glass and ceramics are also included in the materials.

If the substrate comprises metal and is conductive, it may be used as an electrode for directly obtaining electrical current. If it comprises synthetic resin and is insulating, a plating, deposition, or sputtering method may be used to coat a metallic simple substance or alloy and a transparent conductive oxide (TCO) on its surface on which deposited films are formed to form an electrode for obtaining electrical current.

Of course, even if the substrate comprises metal and is conductive, a metallic layer of a different material may be disposed on the side of the substrate on which deposited films are formed to improve the reflectance of light of long wavelengths at the surface of the substrate or to prevent counter diffusion of the component elements between the substrate material and the deposited films. If the substrate is relatively transparent and the photovoltaic device has a layer constitution in which light enters the device from the substrate, a transparent conductive oxide or a conductive film such as a metallic film is preferably deposited and formed on the substrate beforehand.

The surface of the substrate may be smooth or have fine recesses and convexities. If fine recesses and convexities are formed, they are shaped like spheres, cones, or pyramids, and preferably have a maximum height ($R_{max}$) of 0.05 to 2 µm to cause light to be irregularly reflected therefrom, thereby increasing the length of the optical path of reflected light.

The substrate may be shaped like a sheet, long belt, or cylinder with flat or rough surface, and the thickness of the substrate may be determined as appropriate. If, however, the photovoltaic device need be flexible, or light enters the device from the substrate side, the substrate may be as thin as possible as long as the required functions of the substrate can be appropriately provided. The thickness, however, is normally 10 µm or larger in view of the manufacture and handling of the substrate and its mechanical strength.

Back electrode, light reflection layer

Materials for the back electrode preferably include metals with a high reflectance such as aluminum, copper, silver, and gold. If such metal is used, the back electrode can also be used as a light reflection layer for reflecting back to the semiconductor layers light not absorbed by these layers.

The back electrode may be flat, but preferably has recesses and convexities that serve to diffuse light. The formation of recesses and convexities that serve to diffuse light causes light of long wavelengths which cannot be easily absorbed by the semiconductor layers to be diffused so as to increase the optical path length within the semiconductor layers to improve the sensitivity of the photovoltaic device for long wavelengths, thereby increasing short-circuit currents to improve the photoelectric conversion efficiency. For the recesses and convexities that serve to diffuse light, the difference in height between the bottom end of the recess and the top end of the convexity is preferably 0.2 to 2.0 µm at $R_{max}$.

If, however, the substrate is also used as the back electrode, the back electrode need not be formed.

The back electrode is formed using a vapor deposition, sputtering, plating, or printing method. The recesses and convexities that serve to diffuse light are formed by dry etching, wet etching, sand blasting, or heating a film of metal or alloy formed thereon. They may also be formed by depositing the metal or alloy while heating the substrate.

A diffusion prevention layer of conductive zinc oxide, not shown, may also be disposed between the back electrode 102 and the n-type semiconductor layer 103. The effects of this diffusion prevention layer include prevention of the diffusion into the n-type semiconductor layer of metallic elements constituting the back electrode 102, provision of a small resistance value to prevent shorting (generated by defects such as pin holes) between the back electrode 102 and the transparent electrode 106 between which the semiconductor layers are disposed, and the use of a thin film to generate multiple interferences to contain incident light within the photovoltaic device.

Semiconductor layer

Semiconductor materials preferable for use in the photovoltaic device according to this invention are as follows:

(1) i-type semiconductor layer (intrinsic semiconductor layer)

Group IV and Group IV alloy series amorphous semiconductor materials are particularly preferable.

The i-type layer may exhibit some characteristics of a p- or n-type semiconductor layer.

The Group IV and Group IV alloy series amorphous semiconductor materials contain hydrogen atoms (HD) or halogen atoms (X). These atoms serve to compensate for dangling bonds in the i-type layer, thereby improving the product of the mobility and lifetime of carriers in the i-type layer. They also serve to compensate for the interfacial energy levels in the interfaces between the p-type layer and the i-type layer and between the n-type layer and the i-type layer to improve the photoelectromotive force, photoelectric current, and photo response of the photovoltaic device.

The preferable content of hydrogen and/or halogen atoms contained in the i-type layer is 1 to 40 at %. A larger amount of hydrogen and/or halogen atoms is preferably distributed in the interfaces between the p-type layer and the i-type layer or between the n-type layer and the i-type layer, and the content of hydrogen and/or halogen atoms in the neighborhood of the interface is preferably within the range of 10% greater to twice as large as the same content within the bulk. Furthermore, the content of hydrogen and/or halogen atoms preferably varies so as to correspond to the content of silicon atoms.

In the tandem stacked-cell type photovoltaic device, it is preferable that the material of the i-type semiconductor layer in the pin junction which is located near the light incident side have a large band gap, while the materials of the i-type semiconductor layer in the pin junction which is located far from the light incident side have a small band gap. Carbon is used to widen the band gap, while germanium is used to narrow it.

The preferable characteristics of the i-type semiconductor layer of the photovoltaic device according to this invention are a hydrogen content ($C_H$) of 1.0 to 25.0%, AM1.5, a photoconductivity ($\sigma_p$) of $1.0\times10^{-7}$ S/cm or more under pseudo solar radiation of 100 mW/cm², a dark conductivity ($\sigma_d$) of $1.0\times10^{-9}$ S/cm or less, Urbach energy of 55 meV or less as generated by a constant photocurrent method (CPM), and a local energy density of $10^{17}$/cm³.

(2) Buffer layer

The buffer layer is one of the features of this invention, and is important because the characteristics of the photovoltaic device depend on this layer as on the i-type semiconductor and doped layers.

The buffer layer is inserted between the i-type semiconductor layer and the doped layer located above and/or below it. It reduces the number of interfacial energy levels generated when there is a difference between the materials of the doped and i-type semiconductor layers in their composition or crystallinity, and increases the built-in potential of the photovoltaic device and the open circuit voltage ($V_{OC}$). It is substantially intrinsic (i-type). A slightly p- or n-type semiconductor layer including 1% or less of a Group III or Group V atom may also be used as the buffer layer.

The buffer layer according to this invention comprises the same material as the i-type semiconductor layer or the doped layer. If the materials of the i-type semiconductor and doped layers differ, the composition or crystallinity of the buffer layer may be gradually varied in the direction of its film thickness from the material of the i-type semiconductor material to the material of the doped layer.

Like the i-type semiconductor or doped layer, the buffer layer also contains 0.1 to 40 at % of hydrogen (HD) or halogen atoms that serve to compensate for dangling bonds. A larger amount of hydrogen and/or halogen atoms is preferably distributed in the interface with the p-type layer or the n-type layer and the amount of hydrogen and/or halogen atoms in the vicinity of the interface is preferably within the range of 10% more to twice as large as the same content within the bulk. By providing a larger content of hydrogen and/or halogen atoms in the vicinity of the interfaces between the p-type layer and the i-type layer and between the n-type layer and the i-type layer in this manner, defective energy levels and mechanical distortions in the neighborhood of the interface can be reduced.

Furthermore, the preferable characteristics of the buffer according to this invention are AM1.5, a photoconductivity ($\sigma_p$) of $1.0\times10^{-7}$ S/cm or more under pseudo solar radiation of 100 mW/cm², Urbach energy of 70 meV or less generated by a constant photocurrent method (CPM), and a local energy density of $10^{17}$/cm³ or less, depending on the band gap or crystallinity. The film thickness of the buffer layer is preferably 1 to 100 nm, most preferably 5 to 50 nm, also depending on the band gap or crystallinity.

The buffer layer, which is a feature of this invention, is formed by depositing and subsequently exposing its surface to plasma containing elements that increase the band gap in the buffer layer. Plasma processing methods are described below. The elements that increase the band gap in the buffer layer include, for example, C, O, and N if the principal component elements of the buffer layer are Si.

Varying the conditions for processing with plasma containing a band gap increasing element determines the composition ratio of the band gap increasing element in the buffer layer, which is a feature of this invention, in its film thickness direction or enables the buffer layer to be partly microcrystallized or polycrystallized.

(3) p- or n-type semiconductor layer (doped layer)

The p- or n-type semiconductor layer according to this invention is important in that it physically characterizes the photovoltaic devices according to this invention and determines the electrical characteristics.

The material of the p- or n-type semiconductor layer is a Group IV element added with a valence electron control agent. A non-monocrystal material is preferably used. The non-monocrystal material according to this invention refers to amorphous materials (indicated by a-), microcrystal materials (indicated by μc-), and polycrystal materials (indicated by poly-).

In particular, a crystalline semiconductor that absorbs a small amount of light or an amorphous semiconductor with a large band gap is suitable for the p- or n-type layer on the light incident side.

The preferable amount of Group III atoms in the periodic table to be added to the p-type layer and of Group V atoms in the periodic table to be added to the n-type layer is 0.1 to 50 at %.

In addition, hydrogen (HD) or halogen atoms contained in the p- or n-type layer serve to compensate for dangling bonds in the p- or n-type layer and to improve the doped efficiency of the layer. The preferable amount of hydrogen or halogen atoms added to the p- or n-type layer is 0.1 to 40 at %. In particular, it is 0.1 to 8 at % if the p- or n-type layer is crystalline.

A larger amount of hydrogen and/or halogen atoms is preferably contained in the interfaces between the p-type layer and the i-type layer and between the n-type layer and the i-type layer, and the content of hydrogen and/or halogen atoms in the vicinity of the interface is preferably within the range of 10% more to twice as large as the same content within the bulk.

By providing a larger amount of hydrogen and/or halogen atoms in the vicinities of the interfaces between the p-type layer and the i-type layer and between the n-type layer and the i-type layer in this manner, defective energy levels and mechanical distortions in the vicinity of the interface can be reduced to increase the photoelectromotive force and photoelectric current of the photovoltaic device according to this invention.

As for the electric characteristics, the p- and n-type layers of the photovoltaic device have an activation energy of 0.2 eV or less, preferably, 0.1 eV or less. They preferably have a resistivity of 100 Ωcm or less, most preferably, 1 Ωcm or less and a film thickness of to 50 nm, preferably, 3 to 10 nm.

The doped layer, which is a feature of this invention, is formed by depositing and subsequently exposing its surface to a plasma containing elements that increase the band gap in the doped layer. The elements that increase the band gap in the doped layer include, for example, C, O, and N if the principal component elements of the doped layer are Si. This plasma may contain a valence electron control agent of the same type as the doped layer to be processed.

Varying the conditions for processing with the plasma causes the composition ratio of the band gap increasing element in the doped layer to be varied in its thickness direction, or causes the buffer layer to be partly microcrystallized or polycrystallized.

(4) Methods for forming semiconductor layers

Preferable methods for manufacturing Group IV and Group IV alloy series amorphous semiconductor layers as the semiconductor layers of the photovoltaic device according to this invention include, for example, plasma CVD methods using AC or high-frequency waves, which methods comprise RF or microwave plasma CVD methods.

The microwave plasma CVD method introduces a raw material gas such as a dilution gas into a deposition chamber (vacuum chamber) that can be maintained in a reduced pressure condition, maintains the internal pressure of the deposition chamber at a specified value while using an evacuation pump to exhaust the gas, and uses a waveguide to guide microwaves (generated by a microwave power supply) into the deposition chamber via a dielectric window (alumina ceramics) to generate a plasma, thereby decomposing the raw material gas to form a desired deposited film on a substrate located in the deposition chamber.

If a semiconductor layer for the photovoltaic device according to this invention is deposited by the microwave plasma CVD, the preferable ranges of the temperature of the substrate in the deposition chamber, the internal pressure, the microwave power, and the frequency of microwaves are 100° to 450° C., 0.5 to 30 mTorr, 0.01 to 1 W/cm$^2$, and 0.1 to 10 GHz, respectively.

If the semiconductor layer is deposited by the RF plasma CVD, the preferable conditions of the temperature of the substrate in the deposition chamber, the internal pressure, the RF power, and the deposition rate are 100° to 350° C., 0.1 to 10 Torr, 0.001 to 5.0 W/cm$^2$ 0.01 to 3 nm/sec., respectively.

The raw material gas suitable for the deposition of Group IV and Group IV alloy series amorphous semiconductor layers preferably used in the photovoltaic device according to this invention include those compounds such as silane which contain silicon atoms and can be gasified, those compounds such as germane which contain germanium atoms and can be gasified, compounds that contain carbon, nitrogen, and oxygen atoms and can be gasified, and mixed gases of these compounds.

The dopant materials introduced into the p- or n-type layer to control valence electrons include Group III and Group V atoms of the periodic table.

Dopant materials effectively used as a valence electron controlling agent for the p-type layer, in particular, those used to introduce boron atoms include boron hydrides such as $B_2H_6$, $B_4H_{10}$, $B_5H_9$, $B_5H_{11}$, $B_6H_{10}$, $B_6H_{12}$, and $B_6H_{14}$ and boron halides such as $BF_3$ and $BCl_3$. Other dopant materials include $AlCl_3$, $GaCl_3$, $InCl_3$, and $TlCl_3$. In particular, $B_2H_6$ and $BF_3$ are suitable.

Materials effectively used as a valence electron control agent for the n-type layer, in particular, those used to introduce phosphorous include phosphorous hydrides such as $PH_3$ and $P_2H_4$ and phosphorous halides such as $PH_4I$, $PF_3$, $PF_5$, $PCl_3$, $PCl_5$, $PBr_3$, $PBr_5$, and $PI_3$. They may also include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $2BiCl_3$, and $BiBr_3$. In particular, $PH_3$ and $PF_3$ are suitable.

The compounds that can be gasified may be diluted by a gas such as $H_2$, He, Ne, Ar, Xe, or Kr, and then introduced into the deposition chamber.

In particular, if a layer of a microcrystal or polycrystal semiconductor or a-SiC:H that does not absorb a small amount of light or which has a large band gap is deposited, the raw material gas may be diluted by a hydrogen gas in such a way that the ratio will be 1:2 to 100, and a relatively high microwave or RF power may be introduced.

(5) Methods for plasma-processing the doped and buffer layers

The doped layer is plasma-processed using a glow discharge plasma method that introduces a raw material and dilution gases into the deposition chamber (vacuum chamber) that can be maintained in a reduced pressure condition, which then maintains the internal pressure of the deposition chamber at a specified value while using a vacuum pump to exhaust the gas, and which then applies a DC or AC or high frequency to the raw material gas to generate a plasma. Various frequencies ranging from DC to microwaves of about 10 GHz can be used.

The raw material gas includes carbon, oxygen, and nitrogen, that is, the elements for increasing the band gap in the doped layer of the photovoltaic device according to this invention.

Specifically, compounds that contain carbon atoms and which can be gasified include $CH_4$, $CD_4$, $C_nH_{2n+2}$ (n is an integer), $C_nH_{2n}$ (n is an integer), $C_2H_2$, $C_6H_6$, $CO_2$, and CO.

The nitrogen-containing gases include $N_2$, $NH_3$, $ND_3$, NO, $NO_2$, and $N_2O$.

The oxygen-containing gases include $O_2$, CO, $CO_2$, NO, $NO_2$, $N_2O$, $CH_3CH_2OH$, and $CH_3OH$.

The dilution gas includes $H_2$, He, Ne, Ar, Xe, and Kr.

Since no semiconductor material is deposited, the raw material gas suitable for the deposition of a Group IV and Group IV alloy series amorphous semiconductor layers is not necessarily be used. Even if a raw material gas suitable for the deposition of a Group IV and Group IV alloy series amorphous semiconductor layers is used, it is preferable to reduce the pressure of the gas from which plasma is generated or to increase the DC or AC power applied to the plasma or the dilution ratio of the dilution gas, relative to the normal deposition condition, thereby preventing deposition reactions.

The injection of a band gap increasing element using glow discharge plasma as described above substantially differs from the conventional ion implantation used for crystalline silicon. While the conventional ion implantation accelerates ions into a beam to increase their energy, the glow discharge plasma injection maintains the energy of the injected material at a low level, which is injected down to only a very shallow region relative to the surface of the deposited layer. It also enables easy fine-control of the depth of the injected material, thereby allowing the material to be uniformly injected over a large area. Furthermore, it prevents the surface from being damaged by accelerated ions to avoid the degradation of the film quality of the deposited layer, thereby enabling the formation of a doped layer with a small number of local energy levels. Consequently, a doped layer with a good film quality can be uniformly formed over a large area.

The preferable conditions for glow discharge plasma depend on the type of raw material gas and the frequency of power applied to the plasma. For microwave plasma, however, the preferable ranges of the temperature of the substrate in the deposition chamber, the internal pressure, the microwave power, and the frequency of microwaves are 100° to 450° C., 0.5 to 30 mTorr, 0.01 to 1 W/cm$^2$, and 0.1 to 10 GHz, respectively. For DC, AC, LF, or RF plasma, the preferable conditions of the temperature of the substrate in the deposition chamber, the internal pressure, and the applied power are 100° to 350° C., 0.1 to 10 Torr, and 0.01 to 5.0 W/cm$^2$, respectively.

Furthermore, varying the conditions of the glow discharge plasma enables the depth and concentration of the injected band gap increasing element to be controlled and the crystallinity in the vicinity of the surface of the doped layer to be varied. Relevant control methods are described below.

A first method is to control the pressure of the raw material gas. Reducing the pressure of the gas increases the efficiency of injection of the band gap extension element into the doped layer. Although this mechanism has not been clarified, this may be because reducing the pressure of the gas increases the self bias of the electrode to increase the energy of positive ions decomposed in the plasma state. Another possible reason is an increase in the length of the mean free paths of positive ions.

A second method is to control the DC or AC power applied to plasma. Increasing the DC or AC power increases the efficiency of injection of the band gap increasing element into the doped layer. It simultaneously enables the non-crystallization of the vicinity of the doped layer comprising microcrystals or polycrystals. Although this mechanism has not been clarified, this may be because increasing the DC or AC power increases the plasma potential, which increase the energy of positive ions decomposed in the plasma state.

A third method is to contain hydrogen in a gas mixture for plasma processing. Increasing the rate of dilution with hydrogen gas enables the deposition of the raw material gas to be restrained and the concentration of the band gap increasing element in the doped layer to be increased. This may be because the plasma allows the generation of hydrogen ions or radicals which produce etching effects.

Furthermore, the hydrogen gas serves to compensate for dangling bonds in the doped layer generated by the injection of the band gap increasing element to improve the activation of acceptors or donors.

Moreover, the hydrogen serves to increase the band gap in the doped layer near its surface to reduce the amount of light absorbed by the doped layer.

The crystallinity of the vicinity of the surface of the doped layer can be increased by increasing the rate of dilution with hydrogen gas while simultaneously increasing the DC or AC power applied to plasma.

Transparent electrode

The transparent electrode 106 according to this invention functions as an electrode on the light incidence side through which light is transmitted and also acts as an antireflection film through the optimization of its film thickness. The transparent electrode 106 is required to have a high transmission factor for that range of wavelengths which can be absorbed by the semiconductor layers and a low resistivity. Preferably, the transmission at 550 nm is 80% or more, more preferably, 85% or more. The resistivity is preferably $5\times10^{-3}$ $\Omega$cm or less, more preferably, $1\times10^{-3}$ $\Omega$cm or less. Preferable materials include, for example, conductive oxides such as $In_2O_3$, $SnO_2$, ITO ($In_2O_3+SnO_2$), and ZnO, and their mixtures.

Elements that serve to vary the conductivity (dopants) may be added to these compounds.

Preferable methods for forming the transparent electrode 106 include vapor deposition, CVD, spray, spin-on, and dip methods.

Current collecting electrode

The current collecting electrode 107 according to this invention is formed on part of the transparent electrode 106 as required if the resistivity of the transparent electrode cannot be sufficiently reduced. It thus serves to reduce the resistivity of the electrode and the series resistance of the photovoltaic device. Materials for the current collecting electrode include metal wire and a conductive paste formed using a metallic powder.

Figure 3:
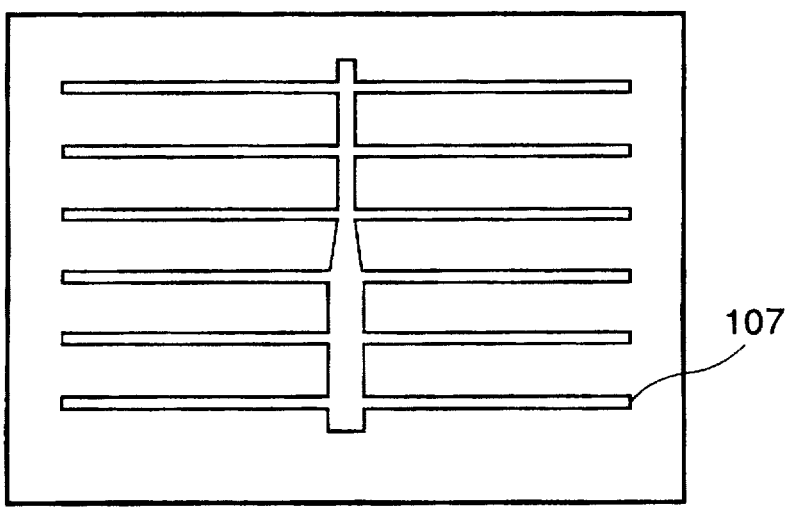
FIG. 3 is a schematic drawing of an example of a photovoltaic device according to this invention as seen from its top.

This electrode is branch-shaped so as not to block light incident on the semiconductor layers, as shown in FIG. 3.

The area of the current collecting electrode is preferably 15% or less, more preferably, 10% or less, most preferably, 5% or less of the total area of the photovoltaic device.

If conductive paste is used, a vapor deposition, sputtering, plating, or printing method is used to form a desired pattern.

EXAMPLES

Example 1

This example series make a structure such as shown in FIG. 1A. That is, a doped layer 103 is formed, and the surface 108 of the doped layer is then exposed to plasma containing band gap increasing elements before the formation of an i-type semiconductor layer 104.

A method for making this device is described below according to its procedures.

(1) A 50×50 mm$^2$ stainless steel support 101 with a thickness of 0.5 mm was ultrasonic-cleaned using acetone and isopropanol, and dried in hot air. A sputtering method was then used to format room temperature a light reflection layer of Ag 0.3 μm in thickness on the surface of the stainless support 101 at and to then form a reflection enhancement layer of ZnO 1.0 μm in thickness thereon at 350° C. to form a back electrode 102. A substrate 490 shown in FIG. 4 was obtained after this step. The procedure will be described below, referring to FIG. 4.

(2) A deposition apparatus 400 was used to form each semiconductor layer on the substrate 490. The deposition apparatus 400 can perform both microwave and RF plasma CVD methods.

(3) The substrate 490 was located on a substrate transfer rail 413 in a loading chamber 401, and a vacuum pump (not shown) was used to evacuate the inside of the loading chamber 401 until the pressure became about $1\times10^{-5}$ Torr.

(4) A gate valve 406 was opened, and the substrate 490 was moved into a transfer chamber 402 and a deposition chamber 417 that had been evacuated in advance using the vacuum pump (not shown). The back surface of the substrate 490 was allowed to contact a substrate heater 410, and the vacuum pump (not shown) was used to evacuate the inside of the deposition chamber 417 until the pressure reached about $1\times10^{-5}$ Torr. Film formation operation was thus ready.

(5) To form an RFn type layer (n-type semiconductor layer formed using an RF plasma CVD method) comprising a-Si, an $H_2$ gas was introduced into the deposition chamber 417 via a gas introduction pipe 429, a valve (not shown) was opened, and a mass flow controller (not shown) was used to adjust the mass flow of the $H_2$ gas so that it could be maintained at 200 sccm. A conductance valve (not shown) was used to adjust the pressure inside the deposition chamber 417 so that it could be maintained at 1.1 Torr.

(6) The substrate heater 410 was set so that the temperature of the substrate 490 could be maintained at 350° C., and when the temperature of the substrate became stable, the valve (not shown) was operated so as to introduce $SiH_4$ and $PH_3/H_2$ gases into the deposition chamber 417 via a gas introduction pipe 429. The mass flow controller (not shown) was used to adjust the mass flows of the $SiH_4$, $H_2$, and $PH_3/H_2$ gases so that they could be maintained at 2, 50, and 0.5 sccm, respectively, and the pressure inside the deposition chamber 417 was adjusted so as to be 1.1 Torr.

(7) The power of an RF high frequency (simply referred to as "RF" below) power supply 422 was set at 0.005 W/cm$^2$. RF power was introduced into a plasma formation cup 420 to generate plasma, and formation of an RFn type layer on the substrate was started. Once an RFn type layer was formed up to 10 nm in thickness, the RF power supply was turned off to stop glow discharge to complete the formation of the RFn type layer.

(8) The flows of the $SiH_4$ and $PH_3/H_2$ gases into the deposition chamber 417 were stopped, and after $H_2$ gas had been allowed to flow into the deposition chamber for five minutes, the flow of $H_2$ was stopped and the inside of the deposition chamber and the gas line were evacuated until the pressure reached $1\times10^{-5}$ Torr.

(9) To expose the surface of the doped layer to plasma containing elements for increasing the band gap of the doped layer, the valve (not shown) was operated so as to introduce $CH_4$ and He gases into the deposition chamber 417 through the gas introduction pipe 429. The mass flow controller was used to adjust the mass flows of the $CH_4$ and He gases so that they could be maintained at 10 sccm and 30 sccm, respectively, and the pressure inside the deposition chamber 417 was adjusted so as to be 0.5 Torr. In addition, the power of the RF power supply 422 was set at 0.06 W/cm² to introduce RF power into the plasma formation cup 420 to generate 9low discharge, thereby exposing the doped layer to plasma containing a band gap increasing element for 300 seconds to form an n-type a-SiC layer on its surface.

(10) The i-type layer comprising a-Si was formed by microwave plasma CVD. A gate valve 407 was opened, and the substrate 490 was moved into a transfer chamber 403 and an i-type layer deposition chamber 418 that had been evacuated in advance using the vacuum pump (not shown). The back surface of the substrate 490 was allowed to contact to a substrate heater 411, and the vacuum pump (not shown) was used to evacuate the inside of the i-type layer deposition chamber 418 until the pressure reached about $1\times10^{-5}$ Torr.

(11) To form an i-type layer, the substrate heater 411 was set so as to heat the substrate 490 to 350° C., and once the substrate had been sufficiently heated, the valve (not shown) was opened slowly to introduce $SiH_4$ and $H_2$ gases into the i-type layer deposition chamber 418 through a gas introduction pipe 449. A mass flow controller (not shown) was used to adjust the mass flows of the $SiH_4$ and $H_2$ gases so that they were maintained at 50 and 100 sccm, respectively. The pressure inside the i-type layer deposition chamber 418 was adjusted to 5 mTorr by opening a conductance valve (not shown).

(12) An RF power supply 424 was set at 0.50 W/cm², and the power was applied to a bias bar 428. The power of a microwave power supply (not shown) was set at 0.20 W/cm², and the microwave power was introduced into the i-type deposition chamber 418 via a microwave introduction waveguide 426 and a microwave introduction window 425 to cause glow discharge. A shutter 427 was opened to initiate formation of an i-type layer on the n-type layer, and the microwave glow discharge was stopped when the thickness of the i-type layer reached 0.1 µm. The output of the bias power supply was turned off to complete the formation of the i-type layer 104.

(13) The valve (not shown) was closed to stop the $SiH_4$ gas from flowing into the i-type deposition cheer 418. $H_2$ gas was then allowed to flow into the i-type layer deposition cheer 418 for two minutes. The valve (not shown) was then closed, and the inside of the i-type layer deposition chamber 418 and the gas line were evacuated so that the pressure therein was maintained at $1\times10^{-5}$ Torr.

(14) A p-type semiconductor layer 105 of µc-Si (microcrystal silicon) was formed using the following procedure.

A gate valve 408 was opened, and the substrate 490 was moved into a transfer chamber 404 and a p-type layer deposition chamber 419 that had been evacuated in advance using the vacuum pump (not shown). The back surface of the substrate 490 was allowed to contact a substrate heater 412, and the vacuum pump (not shown) was used to evacuate the inside of the p-type layer deposition chamber 419 until the pressure reached about $1\times10^{-5}$ Torr.

The substrate heater 412 was set so as to heat the substrate 490 to 230° C., and when the temperature of the substrate became stable, the valve (not shown) was operated so as to introduce an $H_2$, $SiH_4/H_2$, and $BF_3/H_2$ gases into the deposition chamber 419 via a gas introduction pipe 469. The valve (not shown) and the mass flow controller (not shown) were used to adjust the mass flows of the $H_2$, $SiH_4/H_2$, and $BF_3/H_2$ gases so that they were maintained at 50, 0.5, and 0.5 sccm, respectively. The pressure inside the deposition chamber 419 was adjusted to 2.0 Torr by opening a conductance valve (not shown).

The power of an RF power supply 423 was set at 0.15 W/cm², and the RF power was introduced into a plasma formation cup 421 to cause glow discharge to initiate formation of a p-type layer of µc-Si. When the thickness of the p-type layer reached 10 nm, the RF power supply was turned off to stop the glow discharge to complete formation.

(15) The valve (not shown) was closed to stop the $H_2$, $SiH_4/H_2$, and $BF_3/H_2$ gases from flowing into the p-type deposition chamber 419. $H_2$ gas was then allowed to flow into the p-type layer deposition chamber 419 for three minutes. The valve (not shown) was then closed to stop the inflow of $H_2$, and the inside of the p-type layer deposition chamber 419 and the gas line were evacuated so that the pressure therein was maintained at $1\times10^{-5}$ Torr.

(16) A gate valve 409 was opened, and the substrate 490 was transferred into an unloading chamber 405 that had been evacuated in advance using the vacuum pump (not shown). A leak valve (not shown) was opened, and the unloading chamber 405 was leaked.

(17) ITO as the transparent layer 106 was vacuum-deposited on the p-type layer until its thickness reached 70 nm.

(18) A mask with a comb-like pattern of openings therein was placed on the transparent conductive layer 106, and Cr (40 nm), Ag (1,000 nm), and Cr (40 nm) were vacuum-deposited to form a comb-like current collecting electrode 107 as shown in FIG. 3.

The formation of a photovoltaic device was thus finished. This photovoltaic device is referred to as SC Example 1.

Comparative Example 1-1

This example differs from Example 1 in that after a the doped layer had been formed and before the i-type semiconductor layer was formed, the surface of the doped layer was not exposed to plasma containing a band gap increasing element.

The remaining part of the process was similar to Example 1. The photovoltaic device formed according to this example is referred to as SC Comparative Example 1-1.

An evaluation test conducted on six photovoltaic devices obtained in each of Example 1 and Comparative Example 1-1 is described below.

As an evaluation test, each photovoltaic device was placed under AM1.5 (100 mW/cm²) light irradiation to observe the V-I characteristic. Based on the results, the average of the photoelectric conversion efficiency (η) defined as photoelectromotive force/incident light power was calculated, and the average values of the open circuit voltage ($V_{OC}$), short-circuit current ($J_{SC}$), and fill factor (F.F.) were also calculated.

Table 1 shows the photoelectric conversion efficiency (η), open circuit voltage ($V_{OC}$), short-circuit current ($J_{SC}$), and fill factor (F.F.) of SC Example 1 relative to the measured values of SC Comparative Example 1-1.

TABLE 1

|  | Photoelectric conversion efficiency (η) | Open circuit voltage ($V_{OC}$) | Short-circuit current ($J_{SC}$) | Fill Factor (F.F.) |
| --- | --- | --- | --- | --- |
| (SC Example 1) | 1.10 | 1.05 | 1.05 | 1.00 |

Table 1 indicates that the photovoltaic device according to SC Example 1 has better open circuit voltage ($V_{OC}$), short-circuit current ($J_{SC}$), and photoelectric conversion efficiency (η).

Comparative Example 1-2

This example differs from Example 1 in the following three points.

(a) When the RFn type layer was formed, the mass flow controller was used to adjust the mass flows of the $SiH_4$, $CH_4$, $H_2$, and $PH_3/H_2$ gases so that they were maintained at 2, 0.2, 50, and 0.5 sccm, respectively, and the pressure inside the deposition chamber was adjusted to 1.1 Torr.

(b) When the RFn type layer was formed, the power of the RF power supply was set at 0.025 W/cm$^2$, and the RF power was introduced into the plasma formation cup to cause glow discharge to initiate formation of the RFn type layer on the substrate. An RFn type layer of a-SiC 10 nm in thickness was thus formed.

(c) The process for exposing the surface of the doped layer to plasma containing a band gap increasing element before forming the i-type semiconductor layer was omitted.

The remainder of the process was similar to Example 1. The photovoltaic device formed according to this example is referred to as SC Comparative Example 1-2.

An evaluation test conducted on six photovoltaic devices obtained in each of Example 1 and Comparative Example 1-2 is described below.

As an evaluation test, each photovoltaic device was placed under AM1.5 (100 mW/cm$^2$) light irradiation to observe the V-I characteristic. Based on the results, the average of the photoelectric conversion efficiency (η) defined as photoelectromotive force/incident light power was calculated, and the average values of the open circuit voltage ($V_{OC}$), short-circuit current ($J_{SC}$), and fill factor (F.F.) were also calculated.

Table 2 shows the photoelectric conversion efficiency (η), open circuit voltage ($V_{OC}$), short-circuit current ($J_{SC}$), and fill factor (F.F.) of SC Example 1 relative to the measured values of SC Comparative Example 1-2.

TABLE 2

|  | Photoelectric conversion efficiency (η) | Open circuit voltage ($V_{OC}$) | Short-circuit current ($J_{SC}$) | Fill factor (F.F.) |
| --- | --- | --- | --- | --- |
| (SC Example 1) | 1.09 | 1.05 | 1.02 | 1.02 |

Table 2 indicates that the photovoltaic device according to SC Example 1 has better open circuit voltage ($V_{OC}$) and photoelectric conversion efficiency (η).

To observe the nonuniformity and dispersion of the substrate, a mask with 25 holes (0.25 cm$^2$ in area) was placed on the p-type layer, and ITO was vacuum-deposited thereon as a transparent layer until its thickness reached 70 nm. Table 3 shows the results of an examination of the nonuniformity and dispersion of the open circuit voltage ($V_{OC}$) and the fill factor (F.F.) of the substrate. In this table, the maximum value of the same substrate is assumed to be 1.

TABLE 3

|  | Open circuit voltage ($V_{OC}$) | Fill factor (F.F.) |
| --- | --- | --- |
| (SC Example 1) | 0.95–1.00 | 0.97–1.00 |
| (SC Comparative Example 1) | 0.90–1.00 | 0.92–1.00 |

Table 3 shows that SC Example 1 has smaller ununiformity and dispersion and that it can improve the uniformity of the photoelectric conversion characteristic.

Example 2

This example differs from Example 1 in the conditions for forming an RFn type layer of μc-Si, exposing the surface of the doped layer to plasma, and forming an MWi type layer of a-SiGe, as shown below.

(a) Conditions for forming an RFn type layer

An RFn type layer was deposited using an RF plasma CVD method so that it could become μc-Si. The mass flow controller was used to adjust the mass flows of the $SiH_4/H_2$, $H_2$, and $PH_3/H_2$ gases so that they were maintained at 4, 100, and 1 sccm, respectively, and the pressure inside the deposition chamber was adjusted to 0.5 Torr. The substrate heater was set so as to heat the substrate to 380° C., and when the temperature of the substrate became stable, the power of the RF power supply was set at 0.04 W/cm$^2$. The RF power was introduced into the plasma formation cup to cause glow discharge to initiate formation of an RFn type layer on the substrate. An RFn type layer 10 nm in thickness was thus formed.

(b) Conditions for exposing the surface of the doped layer to plasma

To expose the surface of the doped layer to plasma containing a band gap increasing element before forming an i-type semiconductor layer, the valve (not shown) was operated so as to introduce $NH_3$ and He gases into the deposition chamber through the gas introduction pipe. The mass flow controller was used to adjust the mass flows of the $NH_3$ and He gases so that they were maintained at 5 and 35 sccm, respectively, and the pressure inside the deposition chamber was adjusted to 2.0 Torr. The power of the RF power supply was set at 0.06/cm$^2$. The RF power was introduced into the plasma formation cup to cause discharge to expose the RFn type layer to plasma containing a band gap increasing element for 100 seconds. The surface of the RFn type layer was thus noncrystallized so as to become a-SiN to complete the formation of the n-type layer according to this invention.

(c) Conditions for forming a MWi type layer

A MWi type layer (an i-type semiconductor layer formed by the microwave CVD method) was formed using a-SiGe. To form a MWi type layer, the substrate heater was set so as to heat the substrate 380° C., and once the substrate had been sufficiently heated, the valve (not shown) was opened slowly to introduce $SiH_4$, $GeH_4$, and $H_2$ gases into the i-type layer deposition chamber through the gas introduction pipe. The mass flow controller (not shown) was used to adjust the mass flows of the $SiH_4$, $GeH_4$, and $H_2$ gases so that they were maintained at 50, 35, and 120 sccm, respectively. The pressure inside the i-type layer deposition chamber was adjusted to 6 mTorr by opening the conductance valve (not shown). The RF power supply was then set at 0.2 W/cm², and the power was applied to the bias bar. The power of the microwave power supply (not shown) was set at 0.1 W/cm², and the microwave power was introduced into the i-type deposition chamber to cause glow discharge. The shutter was opened to initiate formation of a MWi type layer, and the microwave glow discharge was stopped to complete the formation of the MWi type layer when the thickness of the i-type layer reached 0.1 µm.

The remaining parts of the process were similar to Example 1.

The photovoltaic device formed according to this example is referred to as SC Example 2.

Comparative Example 2-1

This example differs from Example 2 in that after the doped layer had been formed and before the i-type semiconductor layer was formed, the surface of the doped layer was not exposed to plasma containing a band gap extension element.

The remaining parts of the process were similar to Example 2.

An evaluation test conducted on six photovoltaic devices obtained in each of Example 2 and Comparative Example 2-1 is described below.

As an evaluation test, each photovoltaic device was installed under AM1.5 (100 mW/cm²) light irradiation to observe the V-I characteristic. Based on the results, the average of the photoelectric conversion efficiency ($\eta$) defined as photoelectromotive force/incident light power was calculated, and the average values of the open circuit voltage ($V_{OC}$), short-circuit current ($J_{SC}$), and fill factor (F.F.) were also calculated.

Table 4 shows the photoelectric conversion efficiency ($\eta$), open circuit voltage ($V_{OC}$), short-circuit current ($J_{SC}$), and fill factor (F.F.) of SC Example 2 relative to the measured values of SC Comparative Example 2-1.

TABLE 4

|  | Photoelectric conversion efficiency ($\eta$) | Open circuit voltage ($V_{OC}$) | Short-circuit current ($J_{SC}$) | Fill factor (F.F.) |
| --- | --- | --- | --- | --- |
| (SC Example 2) | 1.10 | 1.03 | 1.01 | 1.06 |

Table 4 indicates that the photovoltaic device according to SC Example 2 has better open circuit voltage ($V_{OC}$), fill factor (F.F.), and photoelectric conversion efficiency ($\eta$).

Example 3

This example differs from Example 1 in the conditions for forming the RFn type layer of a-Si, exposing the surface of the doped layer to plasma, and forming the MWi type layer of a-SiC, as shown below.

(a) Conditions for forming RFn type layer

An RFn type layer was deposited using an RF plasma CVD method so that a-Si would be formed. The mass flow controller was used to adjust the mass flows of the $SiH_4$, $H_2$, and $PH_3/H_2$ gases so that they were maintained at 2, 50, and 0.5 sccm, respectively, and the pressure inside the deposition chamber was adjusted to 1.1 Torr. The substrate heater was set so as to heat the substrate to 380° C., and when the temperature of the substrate became stable, the power of the RF power Supply was set at 0.005 W/cm². The RF power was introduced into the plasma formation cup to cause glow discharge to initiate formation of an RFn type layer on the substrate. An RFn type layer 10 nm in thickness was thus formed.

(b) Conditions for exposing the surface of the doped layer to plasma

To expose the surface of the doped layer to plasma containing a band gap increasing element before forming the i-type semiconductor layer, the valve (not shown) was operated so as to introduce $CH_4$ and $H_2$ gases into the deposition chamber through the gas introduction pipe. The mass flow controller was used to adjust the mass flows of the $CH_4$ and $H_2$ gases at 10 and 30 sccm, respectively, and the pressure inside the deposition chamber was adjusted to 1.0 Torr. The power of the RF power supply was set at 0.03/cm². The RF power was introduced into the plasma formation cup to cause glow discharge to expose the RFn type layer to plasma containing a band gap increasing element for 120 seconds. The surface of the RFn type layer was thus crystallized so as to become MC-SiC to complete the formation of the n-type layer according to this invention.

(c) Conditions for forming the MWi type layer

An MWi type layer (an i-type semiconductor layer formed by the microwave CVD method) was formed using a-SiC. To form the MWi type layer, the substrate heater was set so as to heat the substrate 380° C., and once the substrate had been sufficiently heated, the valve (not shown) was opened slowly to introduce $SiH_4$, $CH_4$, and $H_2$ gases into the i-type layer deposition chamber through the gas introduction pipe. The mass flow controller (not shown) was used to adjust the mass flows of the $SiH_4$, $CH_4$, and $H_2$ gases at 50, 35, and 120 sccm, respectively. The pressure inside the i-type layer deposition chamber was adjusted to 6 mTorr. The RF power supply was then set at 0.2 W/cm², and the RF power was applied to the bias bar. The power of the microwave power supply (not shown) was set at 0.1 W/cm², and the microwave power was introduced into the i-type deposition chamber to cause glow discharge. The shutter was opened to initiate formation of the MWi type layer, and the microwave glow discharge was stopped to complete the formation of the MWi type layer when the thickness of the i-type layer reached 0.1 µm.

The remaining part of the process was similar to Example 1.

Comparative Example 3-1

This example differs from Example 3 in that after the doped layer had been formed and before the i-type semiconductor layer was formed, the surface of the doped layer was not exposed to plasma containing a band gap increasing element.

The remaining parts of the process were similar to Example 3.

The photovoltaic device formed according to this example was referred to as SC Comparative Example 3-1.

An evaluation test conducted on six photovoltaic devices obtained in each of Example 3 and Comparative Example 3-1 is described below.

As an evaluation test, each photovoltaic device was placed under AM1.5 (100 mW/cm²) light irradiation to observe the V-I characteristic. Based on the results, the average of the photoelectric conversion efficiency ($\eta$) defined as photoelectromotive force/incident light power was calculated, and the average values of the open circuit voltage ($V_{OC}$), short-circuit current ($J_{SC}$), and fill factor (F.F.) were also calculated.

Table 5 shows the photoelectric conversion efficiency (η), open circuit voltage ($V_{OC}$), short-circuit current ($J_{SC}$), and fill factor (F.F.) of SC Example 3 relative to the measured values of SC Comparative Example 3-1.

TABLE 5

| | Photoelectric conversion efficiency (η) | Open circuit voltage ($V_{OC}$) | Short-circuit current ($J_{SC}$) | Fill Factor (F.F.) |
|---|---|---|---|---|
| (SC Example 3) | 1.08 | 1.04 | 1.03 | 1.01 |

Table 5 indicates that the photovoltaic device according to SC Example 3 has better open circuit voltage ($V_{OC}$), short-circuit current ($J_{SC}$), and photoelectric conversion efficiency (η).

Example 4

This example differs from Example 1 in that an (n) layer is disposed on the light incident side instead of a (p) layer and that the layers are in order: a substrate, a (p) layer, an (i) layer, and an (n) layer instead of a base, an (n) layer, an (i) layer, and a (p) layer.

The conditions for forming an RFp type layer of a-Si, exposing the surface of the doped layer to plasma, and forming an MWi type layer of a-SiC to make a photovoltaic device according to this invention are described below.

(a) Conditions for forming the RFp type layer

The RFp type layer was deposited using an RF plasma CVD method so that it was formed as a-Si. The substrate heater was set to heat the substrate to 350° C., and when the temperature of the substrate became stable, $H_2$, $SiH_4/H_2$, and $BF_3/H_2$ gases were introduced into the deposition chamber. The mass flow controller was used to adjust the mass flows of the $H_2$, $SiH_4/H_2$, and $BF_3/H_2$ gases at 50, 0.5, and 5 sccm, respectively, and the pressure inside the deposition chamber was adjusted to 2.0 Torr. The power of the RF power supply was set at 0.15 W/cm². The RF power was introduced into the plasma formation cup to cause glow discharge to initiate formation of an RFp type layer on the substrate. When the thickness of the RFp type layer reached 10 nm, the RF power supply was turned off to stop glow discharge to complete the formation of the p-type layer.

(b) Conditions for exposing the surface of the doped layer to plasma

To expose the surface of the doped layer to plasma containing a band gap increasing element before forming an i-type semiconductor layer, the valve (not shown) was operated so as to introduce $O_2$/He gas into the deposition chamber through the gas introduction pipe. The mass flow controller was used to adjust the mass flow of the $O_2$/He gas so that it was maintained at 40 sccm, and the pressure inside the deposition chamber was adjusted to 0.5 Torr. The power of the RF power supply was set at 0.06/cm². The RF power was introduced into the plasma formation cup to cause glow discharge to expose the RFp type layer for 100 seconds to plasma containing a band gap increasing element. The surface of the RFp type layer thus became a-SiO, and the formation of the p-type layer according to this invention was completed.

(c) Conditions for forming the MWi type layer

The MWi type layer (an i-type semiconductor layer formed by the microwave CVD method) was formed using conditions similar to those in Example 1.

(d) Conditions for forming the RFn type layer

The RFn type layer was deposited using an RF plasma CVD method so that it would form a-Si. The mass flow controller was used to adjust the mass flows of $H_2$, $SiH_4$, and $PH_3/H_2$ gases so that they could be maintained at 50, 2, and 0.5 sccm, respectively, and the pressure inside the deposition chamber was adjusted to 0.5 Torr. The substrate heater was set so as to heat the substrate to 230° C., and when the temperature of the substrate became stable, the power of the RF power supply was set at 0.005 W/cm². The RF power was introduced into the plasma formation cup to cause glow discharge to initiate formation of an RFn type layer on the substrate. When the thickness of the RFn type layer reached 10 nm, the RF power supply was turned off to stop glow discharge to complete the formation of the n-type layer.

The remaining parts of the process were similar to Example 1.

Comparative Example 4-1

This example differs from Example 4 in that after a doped layer had been formed and before an i-type semiconductor layer was formed, the surface of the doped layer was not exposed to plasma containing a band gap increasing element.

The remaining parts of the process were similar to Example 4.

The photovoltaic device formed according to this example is referred to as SC Comparative Example 4-1.

An evaluation test conducted on six photovoltaic devices obtained in each of Example 4 and Comparative Example 4-1 is described below.

As an evaluation test, each photovoltaic device was placed under AM1.5 (100 mW/cm²) light irradiation to observe the V-I characteristic. Based on the results, the average of the photoelectric conversion efficiency (η) defined as photoelectromotive force/incident light power was calculated, and the average values of the open circuit voltage ($V_{OC}$), short-circuit current ($J_{SC}$), and fill factor (F.F.) were also calculated.

Table 6 shows the photoelectric conversion efficiency (η), open circuit voltage ($V_{OC}$), short-circuit current ($J_{SC}$), and fill factor (F.F.) of SC Example 4 relative to the measured values of SC Comparative Example 4-1.

TABLE 6

| | Photoelectric conversion efficiency (η) | Open circuit voltage ($V_{OC}$) | Short-circuit current ($J_{SC}$) | Fill Factor (F.F.) |
|---|---|---|---|---|
| (SC Example 4) | 1.04 | 1.02 | 1.03 | 0.99 |

Table 6 indicates that the photovoltaic device according to SC Example 4 has a better open circuit voltage ($V_{OC}$), short-circuit current ($J_{SC}$), and photoelectric conversion efficiency (η).

Example 5

This example differs from Example 1 in that a triple-cell type photovoltaic device (a tandem stacked-cell type comprising a structure formed by depositing a pin semiconductor junction three times) shown in FIG. 2A was produced instead of the single-cell type photovoltaic devices shown in FIGS. 1A to 1C.

Figure 4:
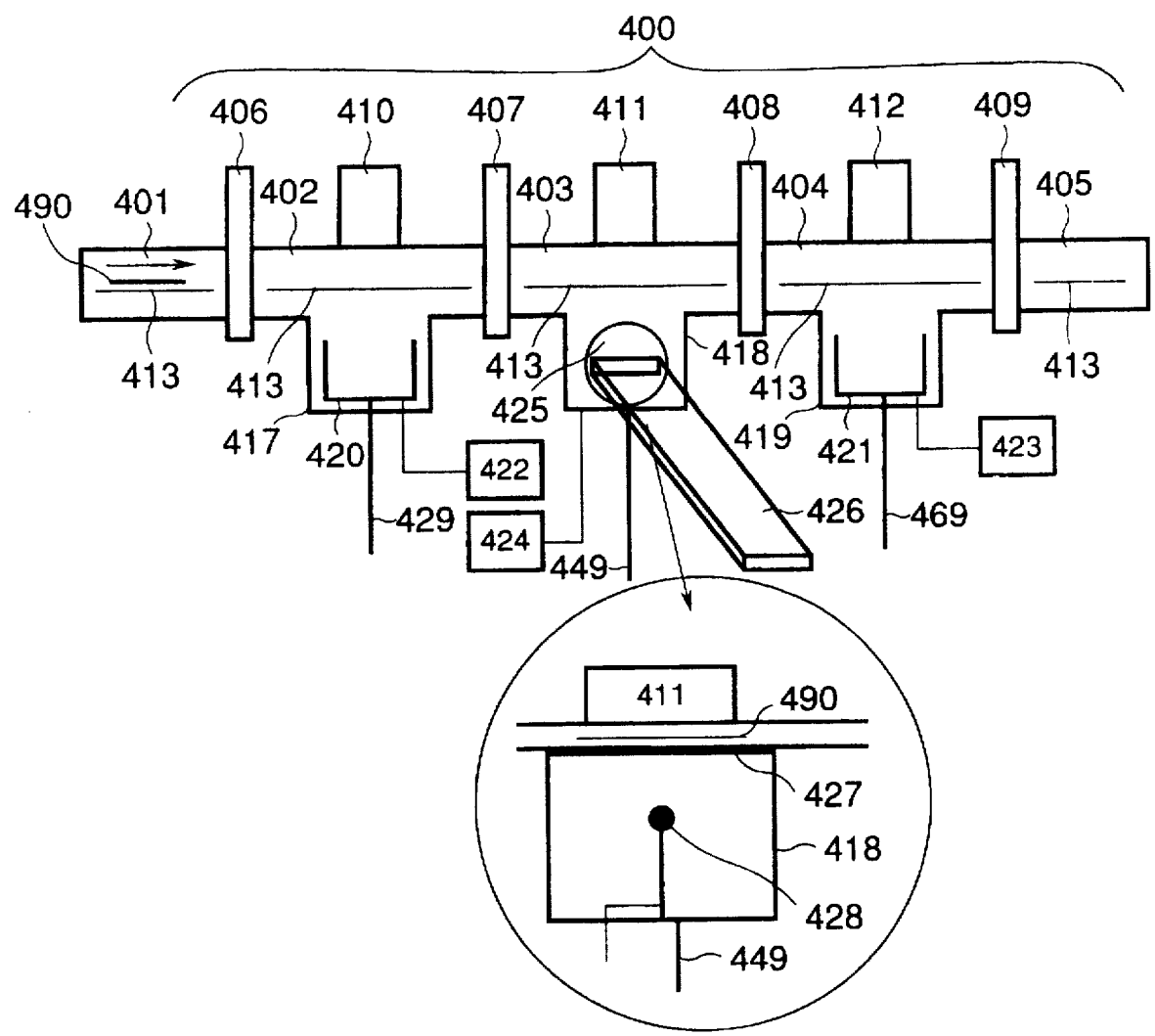
FIG. 4 is a typical explanatory drawing of a multi-chamber deposition apparatus for forming a photovoltaic device according to this invention.

The photovoltaic device according to this example was made using the deposition apparatus shown in FIG. 4.

The layers of the photovoltaic device according to this example were in the order of a substrate 201, a back electrode 202, a first pin junction 214, a second pin junction 215, a third pin junction 216, a transparent electrode 212, and a current collecting electrode 213. Each pin junction was disposed as shown below from the substrate side.

The constitution of the layers in each pin junction according to this example is shown below. Elements for increasing the band gap in the doped layer D are denoted as α.

The first pin junction 214 comprises an RFn type layer (an n1 layer) 203 of μc-Si with its surface amorphized (a-SiC) by exposing it to a plasma containing α, an RFi type layer 251 of a-Si, an MWi type layer (an i1 layer) 204 of a-SiGe, an RFi type layer 261 of a-Si, and a p-type layer (a p1 layer) 205 of μc-Si in this order relative to the back electrode 202.

The second pin junction 215 comprises an n-type layer (an n2 layer) 206 of μc-Si according to this invention with its surface amorphized (a-SiC) by exposing it to a plasma containing α, an RFi type layer 252 of a-Si, an MWi type layer (an i2 layer) 207 of a-SiGe, an RFi type layer 262 of a-Si, and a p-type layer (a p2 layer) 208 of μc-Si in this order relative to the first pin junction 214.

The third pin junction 216 comprises an n-type layer (an n3 layer) 209 of μc-Si according to this invention with its surface amorphized (a-SiC) by exposing it to a plasma containing α, an RFi type layer 210 of a-Si, and a p-type layer (a p3 layer) 211 of μc-Si in this order relative to the second pin junction 215.

A method for forming the first pin junction 214 is now described according to its procedures. The numbers in parentheses indicate the respective steps.

(1) To form an RFn type layer 206 comprising μc-Si, the substrate heater was set so as to heat the substrate to 380° C., and $SiH_4$, $H_2$, and $PH_3/H_2$ gases were introduced into the deposition chamber. The mass flow controller was used to adjust the mass flows of the $SiH_4$, $H_2$ and $PH_3/H_2$ gases at 2, 50, and 0.5 sccm, respectively, and the pressure inside the deposition chamber was adjusted to 1.1 Torr. The power of the RF power supply was set at 0.04 W/cm². The RF power was introduced into the plasma formation cup to cause glow discharge to initiate formation of an RFn type layer on the substrate. When the thickness of the RFn type layer reached 10 nm, the RF power supply was turned off to stop glow discharge to complete the formation of the n-type μc-Si layer.

(2) To expose the surface of the doped layer to plasma containing a band gap increasing element before forming an i-type semiconductor layer, $CH_4$ and He gases were introduced into the deposition chamber. The mass flow controller was used to adjust the mass flows of the $CH_4$ and He gases so that they were maintained at 10 and 30 sccm, respectively, and the pressure inside the deposition chamber was adjusted to 1.0 Torr. The power of the RF power supply was set at 0.06/cm². The RF power was introduced into the plasma formation cup to cause glow discharge to expose the RFp type layer to plasma containing a band gap increasing element for 100 seconds. The surface of the RFn type layer was thus amorphized so as to become a-SiC, and the formation of the n-type layer according to this invention was completed.

(3) An RFi type layer 251 comprising a-Si, an MWi type layer 204 comprising a-SiGe, and an RFi type layer 261 comprising a-Si were sequentially formed using an RF plasma CVD method, a microwave plasma CVD method, and an RF plasma CVD method, respectively.

(3-1) To form the RFi-type layer 251, the temperature of the substrate was first set at 350° C. Once the substrate had been sufficiently heated, $Si_2H_6$ and $H_2$ gases were allowed to flow into the i-type layer deposition chamber. Each mass flow controller was used to adjust the mass flows of the $Si_2H_6$ and $H_2$ gases so that they were 4 and 100 sccm, respectively. The pressure inside the i-type layer deposition chamber was adjusted to 0.8 Torr. The RF power supply 424 was set at 0.007 W/cm², and the power was applied to the bias bar to cause glow discharge. The shutter was opened to initiate formation of the i-type layer on the RFn type layer, and the RF glow discharge was stopped when the thickness of the i-type layer reached 10 nm. The output of the RF power supply then was turned off to complete the formation of the RFi type layer.

(3-2) To form the MWi type layer 204, the temperature of the substrate was first set at 380° C. Once the substrate had been sufficiently heated, $SiH_4$, $GeH_4$, and $H_2$ gases were allowed to flow into the i-type layer deposition chamber. Each mass flow controller was used to adjust the mass flows of the $SiH_4$, $GeH_4$, and $H_2$ gases so that they were 50, 35, and 120 sccm, respectively. The pressure inside the i-type layer deposition chamber was adjusted to 6 mTorr. The RF power supply was set at 0.2 W/cm², and the power was applied to the bias bar. The power of the microwave power supply was set at 0.1 W/cm², and the microwave power was introduced into the i-type deposition chamber to cause glow discharge. The shutter was opened to initiate formation of the MWi type layer on the RFi type layer, and the RF glow discharge was stopped when the thickness of the i-type layer reached 0.1 μm. The output of the bias power supply then was turned off to complete the formation of the MWi type layer.

(3-3) To form the RFi-type layer 261, the temperature of the substrate was first set at 250° C. Once the substrate had been sufficiently heated, $Si_2H_6$ and $H_2$ gases were allowed to flow into the i-type layer deposition chamber. Each mass flow controller was used to adjust the mass flows of the $Si_2H_6$ and $H_2$ gases so that they were 2 and 80 sccm, respectively. The pressure inside the i-type layer deposition chamber was adjusted to 0.7 Torr. The RF power supply was set at 0.007 W/cm², and the power was applied to the bias bar to cause glow discharge. The shutter was opened to initiate formation of the i-type layer on the RFn type layer, and the RF glow discharge was stopped when the thickness of the i-type layer reached 20 nm. The output of the RF power supply then was turned off to complete the formation of the RFi type layer.

(3-4) A p-type semiconductor layer 205 comprising μc-Si was formed. The temperature of the substrate was set at 230° C., and when it became stable, $H_2$, $SiH_4/H_2$, and $BF_3/H_2$ gases were introduced into the deposition chamber. The mass flow controller was used to adjust the mass flows of the $H_2$, $SiH_4/H_2$, and $BF_3/H_2$ gases so that they were 50, 0.5, and 0.5 sccm, respectively, and the pressure inside the deposition chamber was adjusted to 2.0 Torr. The power of the RF power supply was set at 0.15 W/cm². The RF power was introduced into the plasma formation cup to cause glow discharge to initiate formation of a p-type layer comprising μc-Si. When the thickness of the layer reached 10 nm, the RF power supply was turned off to stop glow discharge to finish the formation. Using these steps, the formation of the first pin junction 214 was completed.

A method for producing the second pin junction 215 is described below.

(4) The process for forming the second pin junction 215 was the same as the process for forming the first pin junction 214 except for the conditions for forming an MWi type layer comprising a-SiGe. The difference in the conditions for forming an MWi type layer comprising a-SiGe was that the mass flows of SiH$_4$, GeH$_4$, and H$_2$ gases were maintained at 50, 30, and 120 sccm, respectively. Using these steps, the formation of the second pin junction 215 was completed.

A method for forming the third pin junction 216 is now described according to its procedures. The numbers in parentheses indicate the respective steps.

(5) To form an RFn type layer 209 comprising μc-Si, the substrate heater was first set so as to heat the substrate to 350° C. Except for this step, the RFn type layer 209 according to this invention was produced in the same manner as the RFn type layer 206 in the second pin junction.

(6) To form the RFi type layer 210, the temperature of the substrate was first set at 200° C. Once the substrate was sufficiently heated, Si$_2$H$_6$ and H$_2$ gases were allowed to flow into the i-type layer deposition chamber through the gas introduction pipe 449. Each mass flow controller was used to adjust the mass flows of the Si$_2$H$_6$ and H$_2$ gases so that they were maintained at 2 and 80 sccm, respectively. The pressure inside the i-type layer deposition chamber was adjusted to 0.6 Torr. The RF power supply was set at 0.07 W/cm$^2$, and the power was applied to the bias bar to cause glow discharge. The shutter was opened to initiate formation of the RFi-type layer 210, and the RF glow discharge was stopped when the thickness of the i-type layer reached 120 nm. The output of the RF power supply was then turned off to complete the formation of the RFi type layer.

(7) To form a p-type semiconductor layer 211 of μc-Si, the temperature of the substrate was first set at 170° C. Except for this step, the layer was produced in the same manner as the p-type layer 208 in the second pin junction 215. Using these steps, the formation of the third pin junction 216 was finished.

(8) ITO was vacuum-deposited on the RF type layer 211 as the transparent conductive layer 212 until its thickness reached 70 mm. A mask with a comb-like pattern of openings therein was then placed thereon, and a vacuum deposition method was used to form a comb-like current collecting electrode 213 comprising Cr (40 nm), Ag (1,000 nm), and Cr (40 nm).

Comparative Example 5-1

This example differs from Example 5 in that after a doped layer had been formed and before an i-type semiconductor layer was formed, the surface of the doped layer was not exposed to plasma containing a band gap increasing element.

The remaining parts of the process were similar to Example 5.

The photovoltaic device formed according to this example is referred to as SC Comparative Example 5-1.

An evaluation test conducted on six photovoltaic devices obtained in each of Example 5 and Comparative Example 5-1-1 described below.

As an evaluation test, each photovoltaic device was placed under AM1.5 (100 mW/cm$^2$) light irradiation to observe the V-I characteristic. Based on the results, the average of the photoelectric conversion efficiency (η) defined as photoelectromotive force/incident light power was calculated, and the average values of the open circuit voltage (V$_{OC}$), short-circuit current (J$_{SC}$), and fill factor (F.F.) were also calculated.

Table 7 shows the photoelectric conversion efficiency (η), open circuit voltage (V$_{OC}$), short-circuit current (J$_{SC}$), and fill factor (F.F.) of SC Example 5 relative to the measured values of SC Comparative Example 5-1.

TABLE 7

|  | Photoelectric conversion efficiency (η) | Open circuit voltage (V$_{OC}$) | Short-circuit current (J$_{SC}$) | Fill Factor (F.F.) |
| --- | --- | --- | --- | --- |
| (SC Example 5) | 1.09 | 1.04 | 1.01 | 1.04 |

Table 7 indicates that the photovoltaic device according to SC Example 5 has better open circuit voltage (V$_{OC}$), fill factor (F.F.), and photoelectric conversion efficiency (η).

Comparative Example 5-2

This example differs from Example 5 in the following three points.

(a) When an RFn type layer was formed, the mass flow controller was used to adjust the mass flows of the SiH$_4$, CH$_4$, H$_2$, and PH$_3$/H$_2$ gases at 2, 0.2, 50, and 0.5 sccm, respectively, and the pressure inside the deposition chamber was adjusted to 1.1 Torr.

(b) When an RFn type layer was formed, the power of the RF power supply was set at 0.025 W/cm$^2$, and the RF power was introduced into the plasma formation cup to cause glow discharge to initiate formation of an RFn type layer on the substrate. An RFn type layer of a-SiC 10 nm in thickness was thus formed.

(c) The process for exposing the surface of the doped layer to plasma containing a band gap increasing element before forming an i-type semiconductor layer was omitted.

The remaining parts of the process were similar to Example 5.

The photovoltaic device formed according to this example is referred to as SC Comparative Example 5-2.

An evaluation test conducted on six photovoltaic devices obtained in each of Example 5 and Comparative Example 5-2 is described below.

As an evaluation test, each photovoltaic device was placed under AM1.5 (100 mW/cm$^2$) light irradiation to observe the V-I characteristic. Based on the results, the average of the photoelectric conversion efficiency (η) defined as photoelectromotive force/incident light power was calculated, and the average values of the open circuit voltage (V$_{OC}$), short-circuit current (J$_{SC}$) and fill factor (F.F.) were also calculated.

Table 8 shows the photoelectric conversion efficiency (η), open circuit voltage (V$_{OC}$), short-circuit current (J$_{SC}$) and fill factor (F.F.) of SC Example 5 relative to the measured values of SC Comparative Example 5-2.

TABLE 8

|  | Photoelectric conversion efficiency (η) | Open circuit voltage (V$_{OC}$) | Short-circuit current (J$_{SC}$) | Fill Factor (F.F.) |
| --- | --- | --- | --- | --- |
| (SC Example 5) | 1.10 | 1.05 | 1.01 | 1.04 |

Table 8 indicates that the photovoltaic device according to SC Example 5 has better open circuit voltage (V$_{OC}$), fill factor (F.F.), and photoelectric conversion efficiency (η).

To observe the nonuniformity and dispersion inside the substrate, a mask with 25 holes (0.25 cm$^2$ in area) was placed on the p-type layer, and ITO was vacuum-deposited thereon as a transparent layer until its thickness reached 70 nm. Table 9 shows the results of an examination of the nonuniformity and dispersion of the open circuit voltage ($V_{OC}$) and the fill factor (F.F.) inside the substrate. In this table, the maximum value in the same substrate is assumed to be 1.

TABLE 9

|  | Open circuit voltage ($V_{OC}$) | Fill Factor (F.F.) |
| --- | --- | --- |
| (SC Example 5) | 0.95–1.00 | 0.97–1.00 |
| (SC Comparative Example 5-2) | 0.90–1.00 | 0.92–1.00 |

Table 9 shows that SC Example 5 has smaller nonuniformity and dispersion and that it can improve the uniformity of the photoelectric conversion characteristic.

The next series of examples is similar to Examples 1 through 5 except that the doped layer was processed using a plasma containing both a band gap increasing element and a valence electron control agent.

Example 6

A photovoltaic device was produced in the same manner as in Example 1 except that 5 sccm of $PH_3$/He gas was further introduced in step (9).

Comparative Example 6-1

This example differs from Example 6 in that after the doped layer was formed and before the i-type semiconductor layer was formed, the surface of the doped layer was not exposed to plasma containing both a band gap increasing element and a valence electron control agent.

The remaining parts of the process were similar to Example 6.

The photovoltaic device formed according to this example is referred to as SC Comparative Example 6-1.

The results of evaluations conducted in the same way as Example 1 are shown below.

TABLE 10

|  | Photoelectric conversion efficiency (η) | Open circuit voltage ($V_{OC}$) | Short-circuit current ($J_{SC}$) | Fill Factor (F.F.) |
| --- | --- | --- | --- | --- |
| (SC Example 6) | 1.12 | 1.07 | 1.05 | 1.00 |

Table 10 indicates that the photovoltaic device according to SC Example 6 has better open circuit voltage ($V_{OC}$), short-circuit current ($J_{SC}$), and photoelectric conversion efficiency (η).

Comparative Example 6-2

This example differs from Example 6 in the following three points.

(a) When an RFn type layer was formed, the mass flow controller was used to adjust the mass flows of the $SiH_4$, $CH_4$, $H_2$, and $PH_3/H_2$ gases at 2, 0.2, 50, and 0.5 sccm, respectively, and the pressure inside the deposition chamber was adjusted to 1.1 Torr.

(b) When an RFn type layer was formed, the power of the RF power supply was set at 0.025 W/cm², and the RF power was introduced into the plasma formation cup to cause glow discharge to initiate formation of the RFn type layer on the substrate. An RFn type layer of a-SiC 10 nm in thickness was thus formed.

(c) The process for exposing the surface of the doped layer to plasma containing both a band gap increasing extension element and a valence electron control agent of the same type as the doped layer before forming the i-type semiconductor layer was omitted.

The remaining parts of the process were similar to Example 6.

The results of evaluations conducted in the same way as Example 1 are shown below.

TABLE 11

|  | Photoelectric conversion efficiency (η) | Open circuit voltage ($V_{OC}$) | Short-circuit current ($J_{SC}$) | Fill Factor (F.F.) |
| --- | --- | --- | --- | --- |
| (SC Example 6) | 1.11 | 1.07 | 1.02 | 1.02 |

Table 11 indicates that the photovoltaic device according to SC Example 6 has better open circuit voltage ($V_{OC}$) and photoelectric conversion efficiency (η).

Table 12 shows the results of an examination of the nonuniformity and dispersion of the open circuit voltage ($V_{OC}$) and the fill factor (F.F.) inside the substrate. In this table, the maximum value in the same substrate is assumed to be 1.

TABLE 12

|  | Open circuit voltage ($V_{OC}$) | Fill Factor (F.F.) |
| --- | --- | --- |
| (SC Example 6) | 0.95–1.00 | 0.97–1.00 |
| (SC Comparative Example 6-2) | 0.90–1.00 | 0.92–1.00 |

Table 12 shows that SC Example 6 has smaller nonuniformity and dispersion and that it can improve the uniformity of the photoelectric conversion characteristic.

Example 7

A photovoltaic device was produced in the same manner as in Example 2 except that 5 sccm of $PH_3$/He gas was further introduced in step (b).

Comparative Example 7-1

This example differs from Example 7 in that after the doped layer was formed and before the i-type semiconductor layer was formed, the surface of the doped layer was not exposed to plasma containing both a band gap increasing element and a valence electron control agent.

The remaining parts of the process were similar to Example 7.

The photovoltaic device formed according to this example is referred to as SC Comparative Example 7-1.

The results of evaluations conducted in the same way as Example 2 are shown below.

TABLE 13

|  | Photoelectric conversion efficiency (η) | Open circuit voltage ($V_{OC}$) | Short-circuit current ($J_{SC}$) | Fill Factor (F.F.) |
| --- | --- | --- | --- | --- |
| (SC Example 7) | 1.12 | 1.05 | 1.01 | 1.06 |

Table 13 indicates that the photovoltaic device according to SC Example 7 has better open circuit voltage ($V_{OC}$), fill factor (F.F.), and photoelectric conversion efficiency (η).

Example 8

A photovoltaic device was produced in the same manner as in Example 3 except that 5 sccm of $PH_3$/He gas was further introduced in step (b).

Comparative Example 8-1

This example differs from Example 8 in that after the doped layer was formed and before the i-type semiconductor layer was formed, the surface of the doped layer was not exposed to plasma containing both a band gap increasing element and a valence electron control agent.

The remaining parts of the process were similar to Example 8.

The photovoltaic device formed according to this example is referred to as SC Comparative Example 8-1.

The results of evaluations conducted in the same way as Example 3 are shown below.

TABLE 14

| | Photoelectric conversion efficiency ($\eta$) | Open circuit voltage ($V_{OC}$) | Short-circuit current ($J_{SC}$) | Fill Factor (F.F.) |
|---|---|---|---|---|
| (SC Example 8) | 1.10 | 1.06 | 1.03 | 1.01 |

Table 14 indicates that the photovoltaic device according to SC Example 8 has better open circuit voltage ($V_{OC}$), short-circuit current ($J_{SC}$), and photoelectric conversion efficiency ($\eta$).

Example 9

A photovoltaic device was produced in the same manner as in Example 4 except that 5 sccm of $PH_3$/He gas was further introduced in step (b).

Comparative Example 9-1

This example differs from Example 9 in that after the doped layer was formed and before the i-type semiconductor layer was formed, the surface of the doped layer was not exposed to plasma containing both a band gap increasing element and a valence electron control agent.

The remaining parts of the process were similar to Example 9.

The photovoltaic device formed according to this example is referred to as SC Comparative Example 9-1.

The results of evaluations conducted in the same way as Example 4 are shown below.

TABLE 15

| | Photoelectric conversion efficiency ($\eta$) | Open circuit voltage ($V_{oc}$) | Short-circuit current ($J_{sc}$) | Fill Factor (F.F.) |
|---|---|---|---|---|
| (SC Example 9) | 1.06 | 1.04 | 1.03 | 0.99 |

Table 15 indicates that the photovoltaic device according to SC Example 9 has better open circuit voltage ($V_{OC}$), short-circuit current ($J_{SC}$), and photoelectric conversion efficiency ($\eta$).

Example 10

A photovoltaic device was produced in the same manner as in Example 5 except that 5 sccm of $PH_3$/He gas was further introduced in step (2).

Comparative Example 10-1

This example differs from Example 10 in that after the doped layer was formed and before the i-type semiconductor layer was formed, the surface of the doped layer was not exposed to plasma containing both a band gap increasing element and a valence electron control agent.

The remaining parts of the process were similar to Example 10.

The photovoltaic device formed according to this example is referred to as SC Comparative Example 10-1.

The results of evaluations conducted in the same way as Example 5 are shown below.

TABLE 16

| | Photoelectric conversion efficiency ($\eta$) | Open circuit voltage ($V_{oc}$) | Short-circuit current ($J_{sc}$) | Fill Factor (F.F.) |
|---|---|---|---|---|
| (SC Example 10) | 1.11 | 1.06 | 1.01 | 1.04 |

Table 16 indicates that the photovoltaic device according to SC Example 10 has better open circuit voltage ($V_{OC}$), fill factor (F.F.), and photoelectric conversion efficiency ($\eta$).

Comparative Example 10-2

This example differs from Example 10 in the following three points.

(a) When an RFn type layer was formed, the mass flow controller was used to adjust the mass flows of the $SiH_4$, $CH_4$, $H_2$, and $PH_3/H_2$ gases to 2, 0.2, 50, and 0.5 sccm, respectively, and the pressure inside the deposition chamber was adjusted to 1.1 Torr.

(b) When an RFn type layer was formed, the power of the RF power supply was set at 0.025 W/cm², and the RF power was introduced into the plasma formation cup to cause glow discharge to initiate formation of an RFn type layer on the substrate. An RFn type layer of a-SiC 10 nm in thickness was thus formed.

(c) The process for exposing the surface of the doped layer to plasma containing both a band gap increasing element and a valence electron control agent of the same type as the doped layer before forming the i-type semiconductor layer was omitted.

The remaining parts of the process were similar to Example 10.

The photovoltaic device formed according to this example is referred to as SC Comparative Example 10-2.

The results of evaluations conducted in the same way as Example 5 are shown below.

TABLE 17

| | Photoelectric conversion efficiency ($\eta$) | Open circuit voltage ($V_{oc}$) | Short-circuit current ($J_{sc}$) | Fill Factor (F.F.) |
|---|---|---|---|---|
| (SC Example 10) | 1.12 | 1.07 | 1.01 | 1.04 |

Table 17 indicates that the photovoltaic device according to SC Example 10 has a better open circuit voltage ($V_{OC}$), fill factor (F.F.), and photoelectric conversion efficiency ($\eta$).

Table 18 shows the results of an examination of the nonuniformity and dispersion of the open circuit voltage ($V_{OC}$) and the fill factor (F.F.) inside the substrate. In this table, the maximum value in the same substrate is assumed to be 1.

TABLE 18

|  | Open circuit voltage ($V_{oc}$) | Fill Factor (F.F.) |
|---|---|---|
| (SC Example 10) | 0.95–1.00 | 0.97–1.00 |
| (SC comparative Example 10-2) | 0.90–1.00 | 0.92–100 |

Table 18 shows that SC Example 10 has smaller nonuniformity and dispersion and that it can improve the uniformity of the photoelectric conversion characteristic.

In this series of examples, a structure shown in FIG. 1B was produced. Specifically, a doped layer 105 was formed on an i-type semiconductor layer 104, and the surface of the doped layer 109 was then exposed to plasma containing a band gap increasing element.

Example 11

A photoelectric device was produced in the same manner as in Example 1 except that the step (9) for exposing the doped layer to plasma containing a band gap increasing element was carried out after the step (15) for forming the doped layer on an i-type layer.

Comparative Example 11-1

This example differs from Example 11 in that after the i-type semiconductor layer was formed, the surface of the doped layer was not exposed to plasma containing a band gap increasing element.

The remaining parts of the process were similar to Example 11.

The photovoltaic device formed according to this example is referred to as SC Comparative Example 11-1.

The results of evaluations conducted in the same way as Example 1 are shown below.

TABLE 19

|  | Photoelectric conversion efficiency (η) | Open circuit voltage ($V_{oc}$) | Short-circuit current ($J_{sc}$) | Fill Factor (F.F.) |
|---|---|---|---|---|
| (SC Example 11) | 1.12 | 1.05 | 1.07 | 1.00 |

Table 19 indicates that the photovoltaic device according to SC Example 11 has better open circuit voltage ($V_{OC}$), short-circuit current ($J_{SC}$), and photoelectric conversion efficiency (η).

Comparative Example 11-2

This example differs from Example 11 in the following three points.

(a) When an RFp type layer was formed, the mass flow controller was used to adjust the mass flows of the $H_2$, $SiH_4$, $CH_4$ and $BF_3/H_2$ gases to 50, 2, 0.2, and 0.5 sccm, respectively, and the pressure inside the deposition chamber was adjusted to 1.1 Torr.

(b) When an RFp type layer was formed, the power of the RF power supply was set at 0.10 W/cm², and the RF power was introduced into the plasma formation cup to cause glow discharge to initiate formation of an RFp type layer on the substrate. An RFp type layer of a-SiC 10 nm in thickness was thus formed.

(c) After forming a p-type doped layer on the i-type semiconductor layer, the process for exposing the surface of the doped layer to a plasma containing elements for increasing the band gap in the doped layer was omitted.

The remaining parts of the process were similar to Example 11.

The photovoltaic device formed according to this example is referred to as SC Comparative Example 11-2.

The results of evaluations conducted in the same way as Example 1 are shown below.

TABLE 20

|  | Photoelectric conversion efficiency (η) | Open circuit voltage ($V_{oc}$) | Short-circuit current ($J_{sc}$) | Fill Factor (F.F.) |
|---|---|---|---|---|
| (SC Example 11) | 1.10 | 1.01 | 1.04 | 1.05 |

Table 20 indicates that the photovoltaic device according to SC Example 11 has better short-circuit current ($J_{SC}$), fill factor (F.F.), and photoelectric conversion efficiency (η).

Table 21 shows the results of an examination of the nonuniformity and dispersion of the open circuit voltage ($V_{OC}$) and the fill factor (F.F.) inside the substrate.

In this table, the maximum value in the same substrate is assumed to be 1.

TABLE 21

|  | Open circuit voltage ($V_{oc}$) | Fill Factor (F.F.) |
|---|---|---|
| (SC Example 11) | 0.95–1.00 | 0.97–1.00 |
| (SC Comparative Example 11-2) | 0.90–1.00 | 0.92–1.00 |

Table 21 shows that SC Example 11 has smaller nonuniformity and dispersion and that it can improve the uniformity of the photoelectric conversion characteristic.

Example 12

This example differs from Example 11 in the conditions for forming an MWi type layer of a-SiGe, forming a p-type semiconductor layer of a-Si, and exposing the surface of the doped layer to a plasma, as shown below.

(a) Conditions for forming an RFn type layer

An RFn type layer was produced under the same conditions as in Example 11.

(b) Conditions for forming an MWi type layer

An MWi type layer (an i-type semiconductor layer formed by the microwave CVD method) was formed using a-SiGe. To form the MWi type layer, the substrate heater was set to heat the substrate to 380° C., and once the substrate was sufficiently heated, the valve (not shown) was opened slowly to introduce $SiH_4$, $GeH_4$, and $H_2$ gases into the i-type layer deposition cheer through the gas introduction pipe. The mass flow controller (not shown) was used to adjust the mass flows of the $SiH_4$, $GeH_4$, and $H_2$ gases at 50, 35, and 120 sccm, respectively. The pressure inside the i-type layer deposition cheer was adjusted to 6 mTorr by opening the conductance valve (not shown). The RF power supply was then set at 0.2 W/cm², and the power was applied to the bias bar. The power of the microwave power supply (not shown) was set at 0.1 W/cm², and the microwave power was introduced into the i-type layer deposition chamber to cause glow discharge. The shutter was opened to initiate formation of an i-type layer on the n-type layer, and when the thickness of the i-type layer reached 0.1 μm, the microwave glow discharge was stopped to complete the formation of the MWi layer.

(c) Conditions for forming a p-type semiconductor layer

A p-type semiconductor layer of a-Si was formed using the following procedure.

The substrate heater was set to heat the substrate 230° C., and the mass flow controller was used to adjust the mass flows of the $H_2$, $SiH_4$, and $BF_3/H_2$ gases at 50, 2, and 0.5 sccm, respectively. The pressure inside the deposition chamber was adjusted to 1.1 Torr.

The power of the RF power supply was set at 0.05 W/cm$^2$, and the RF power was introduced into the plasma formation cup to cause glow discharge to initiate formation of a p-type layer of a-Si. When the thickness of the p-type layer reached 10 nm, the RF power supply was turned off to stop the glow discharge to complete the formation.

(d) Conditions for exposing the surface of the doped layer to plasma

A p-type doped layer was formed on the i-type semiconductor layer. Then, to expose the surface of the doped layer to a plasma containing elements for increasing the band gap in the doped layer, the valve (not shown) was operated so as to introduce $NH_3$ and He gases into the deposition chamber through the gas introduction pipe. The mass flow controller was used to adjust the mass flows of the $NH_3$ and He gases so that they were maintained at 5 and 35 sccm, respectively, and the pressure inside the deposition chamber was adjusted to 2.0 Torr. The power of the RF power supply was set at 0.06 W/cm$^2$ to introduce RF power into the plasma formation cup to generate glow discharge. The RFp layer was thus exposed to plasma containing a band gap increasing element for 100 seconds to amorphize the surface of the RFp-type layer so that it would form as a-SiN. The formation of the p-type layer according to this invention was thus completed.

The remaining parts of the process was similar to Example 11.

Comparative Example 12-1

This example differs from Example 12 in that after a doped layer was formed on the i-type semiconductor layer, the surface of the doped layer was not exposed to plasma containing a band gap increasing element. The remaining parts of the process were similar to Example 12.

The photovoltaic device formed according to this example is referred to as SC Comparative Example 12-1

The results of evaluations conducted in the same way as in Example 2 are shown below.

TABLE 22

| | Photoelectric conversion efficiency (η) | Open circuit voltage ($V_{oc}$) | Short-circuit current ($J_{sc}$) | Fill Factor (F.F.) |
| --- | --- | --- | --- | --- |
| (SC Example 11) | 1.10 | 1.04 | 1.06 | 1.00 |

Table 22 indicates that the photovoltaic device according to SC Example 12 has better open circuit voltage ($V_{OC}$), short-circuit current ($J_{SC}$), and photoelectric conversion efficiency (η).

Example 13

This example differs from Example 11 in the conditions for forming an MWi type layer of a-SiC, forming a p-type semiconductor layer of a-Si, and exposing the surface of the doped layer to plasma, as shown below.

(a) Conditions for forming an RFn type layer

An RFn type layer was produced under the same conditions as in Example 11.

(b) Conditions for forming an MWi type layer

An MWi type layer was formed using a-SiC. To form the MWi type layer, the substrate heater was set to heat the substrate to 380° C., and once the substrate was sufficiently heated, the valve (not shown) was opened slowly to introduce $SiH_4$, $CH_4$, and $H_2$ gases into the i-type layer deposition chamber. The mass flow controller (not shown) was used to adjust the mass flows of the $SiH_4$, $CH_4$, and $H_2$ gases at 50, 35, and 120 sccm, respectively. The pressure inside the i-type layer deposition chamber was adjusted to 6 m Torr. The RF power supply was then set at 0.2 W/cm$^2$, and the power was applied to the bias bar. The power of the microwave power supply (not shown) was set at 0.1 W/cm$^2$, and the power was applied to the bias bar. The power of the microwave power supply (not shown) was set at 0.1 W/cm$^2$, and the microwave power was introduced into the i-type layer deposition chamber to cause glow discharge. The shutter was opened to initiate formation of the MWi type layer on the RFi-type layer, and when the thickness of the i-type layer reached 0.1 μm, the microwave glow discharge was stopped to complete the formation of the MWi layer.

(c) Conditions for forming a p-type semiconductor layer.

A p-type semiconductor layer of a-Si was formed using the following procedure.

The substrate heater was set to heat the substrate 230° C., and the mass flow controller was used to adjust the mass flows of the $H_2$, $SiH_4$, and $BF_3/H_2$ gases at 50, 2, and 0.5 sccm, respectively. The pressure inside the deposition chamber was adjusted to 1.1 Torr. The power of the RF power supply was set at 0.05 W/cm$^2$, and the RF power was introduced into the plasma formation cup to cause glow discharge to initiate formation of a p-type layer of a-Si. When the thickness of the p-type layer reached 10 nm, the RF power supply was turned off to stop the glow discharge to complete the formation.

(d) Conditions for exposing the surface of the doped layer to plasma

A p-type doped layer was formed on the i-type semiconductor layer. Then, to expose the surface of the doped layer to plasma containing elements for increasing the band gap in the doped layer, the valve (not shown) was operated so as to introduce $CH_4$ and $H_2$ gases into the deposition chamber through the gas introduction pipe. The mass flow controller was used to adjust the mass flows of the $CH_4$ and $H_2$ gases at 10 and 30 sccm, respectively, and the pressure inside the deposition chamber was adjusted to 1.0 Torr. The power of the RF power supply was set at 0.03 W/cm$^2$ to introduce RF power into the plasma formation cup to generate glow discharge. The RFp layer was thus exposed to plasma containing a band gap increasing element for 120 seconds to amorphize the surface of the RFp-type layer so that it could become a-SiC. The formation of the p-type layer according to this invention was thus completed.

The remaining parts of the process were similar to Example 11.

Comparative Example 13-1

This example differs from Example 13 in that after the doped layer was formed on the i-type semiconductor layer, the surface of the doped layer was not exposed to plasma containing a band gap increasing element.

The remaining parts of the process were similar to Example 13.

The photovoltaic device formed according to this example is referred to as SC Comparative Example 13-1.

The results of evaluations conducted in the same way as in Example 3 are shown below.

TABLE 23

|  | Photoelectric conversion efficiency (η) | Open circuit voltage ($V_{oc}$) | Short-circuit current ($J_{sc}$) | Fill Factor (F.F.) |
| --- | --- | --- | --- | --- |
| (SC Example 13) | 1.12 | 1.05 | 1.06 | 1.01 |

Table 23 indicates that the photovoltaic device according to SC Example 13 has better open circuit voltage ($V_{OC}$), short-circuit current ($J_{SC}$), and photoelectric conversion efficiency (η).

Example 14

This example differs from Example 11 in that an (n) layer instead of a (p) layer is disposed on the light incident side and that the layers are constituted in the order of a substrate, a (p) layer, an (i) layer, and an (n) layer, an (n) layer, an (i) layer, and a (p) layer.

The conditions for forming an RFp type layer of a-Si, exposing the surface of the doped layer to a plasma, forming an MWi type layer of a-SiC, and forming an RFn type layer of a-Si to make a photovoltaic device—according to this invention are described below.

(a) Conditions for forming an RFp type layer

An RFp type layer was deposited using an RF plasma CVD method so that it would be formed as a-Si. The mass flow controller was used to adjust the mass flows of the $H_2$, $SiH_4/H_2$, and $BF_3/H_2$ gases at 50, 0.5, and 5 sccm, respectively, and the pressure inside the deposition chamber was adjusted to 2.0 Torr. The power of the RF power supply was set at 0.15 W/cm². The RF power was introduced into the plasma formation cup to cause glow discharge to initiate formation of an RFp type layer on the substrate. An RFp type layer 10 nm in thickness was thus formed.

(b) Conditions for forming an MWi type layer

An MWi type layer (an i-type semiconductor layer formed by the microwave CVD method) was produced in the same conditions as in Example 1.

(c) Conditions for forming an RFn type layer An RFn type layer was deposited using an RF plasma CVD method so that it would form as a-Si. The mass flow controller was used to adjust the mass flows of the $H_2$, $SiH_4$, and $PH_3/H_2$ gases at 50, 2, and 0.5 sccm, respectively, and the pressure inside the deposition chamber was adjusted to 0.5 Torr. The substrate heater was set to heat the substrate to 230° C., and when the temperature of the substrate became stable, the power of the RF power supply was set at 0.005 W/cm². The RF power was introduced into the plasma formation cup to cause glow discharge to initiate formation of an n-type layer on the substrate. An RFp type 10 nm in thickness was thus formed. The RF power supply was then turned off to stop glow discharge to complete the formation of the n-type layer.

(d) Conditions for exposing the surface of the doped layer to plasma

An n-type doped layer was formed on the i-type semiconductor layer. To expose the surface of the doped layer to a plasma containing elements for increasing the band gap thereof, the valve (not shown) was operated so as to introduce $O_2/He$ gas into the deposition chamber through the gas introduction pipe. The mass flow controller was used to adjust the mass flow of the $O_2/He$ gas at 40 sccm, and the pressure inside the deposition chamber was adjusted to 0.5 Torr. The power of the RF power supply was set at 0.06 W/cm². The RF power was introduced into the plasma formation cup to cause glow discharge to expose the RFn type layer to a plasma containing a band gap increasing element for 100 seconds. The surface of the RFn type layer was thus amorphized to become a-SiO, and the formation of the n-type layer according to this invention was completed.

The remaining parts of the process were similar to Example 11.

Comparative Example 14-1

This example differs from Example 14 in that after a doped layer D was formed on the i-type semiconductor layer, the surface of the doped layer D was not exposed to plasma containing α.

The remaining parts of the process were similar to Example 14.

The photovoltaic device formed according to this example is referred to as SC Comparative Example 14-1.

The results of evaluations conducted in the same way as Example 4 are shown below.

TABLE 24

|  | Photoelectric conversion efficiency (η) | Open circuit voltage ($V_{oc}$) | Short-circuit current ($J_{sc}$) | Fill Factor (F.F.) |
| --- | --- | --- | --- | --- |
| (SC Example 14) | 1.08 | 1.04 | 1.05 | 0.99 |

Table 24 indicates that the photovoltaic device according to SC Example 14 has better open circuit voltage ($V_{OC}$), short-circuit current ($J_{SC}$), and photoelectric conversion efficiency (η).

Example 15

This example differs from Example 11 in that the triple-cell type photovoltaic device (a tandem stacked cell type comprising a structure formed by depositing a pin semiconductor junction three times) shown in FIG. 2A was produced instead of the single-cell type photovoltaic device shown in FIG. 1A.

The photovoltaic device according to this example was made using the deposition apparatus shown in FIG. 4.

The layers of the photovoltaic device according to this example were in the order of the substrate 201, the back electrode 202, the first pin junction 214, the second pin junction 215, the third pin junction 216, the transparent electrode 212, and the current collecting electrode 213.

The constitution of the layers in each pin junction according to this example is shown below. Elements for extending the band gap in the doped layer D are denoted as α.

The first pin junction 214 comprises the RFn type layer (the n1 layer) 203 of μc-Si, the RFi type layer 251 of a-Si, the MWi type layer (the i1 layer) 204 of a-SiGe, the RFi type layer 261 of a-Si, and an RFp-type layer 205 in this order relative to the back electrode 202. A doped layer D was formed thereon, and its surface was amorphized by exposing it to a plasma containing α so as to become a p-type layer (a p1 layer) 205 of a-Si or a-SiC.

The second pin junction 215 comprises the RFn-type layer (the n2 layer) 206 of μc-Si, the RFi type layer 252 of a-Si, the MWi type layer (the i1 layer) 207 of a-SiGe, the RFi type layer 262 of a-Si, and the p-type layer (the p2 layer) 208 of µc-Si or pc-SiC according to this invention, in this order relative to the first pin junction 214.

The third pin junction 216 comprises the RFn-type layer (the n3 layer) 209 of µc-Si, the RFi type layer 210 of a-Si, and the p-type layer (the p3 layer) 211 of µc-Si or µc-SiC according to this invention, in this order relative to the second pin junction 215.

A method for forming the first pin junction 214 is now described according to its procedures. The numbers in parentheses indicate the respective steps.

(1) To form an RFn type layer comprising µc-Si, the substrate heater was set to heat the substrate to 380° C., and $SiH_4$, $H_2$, and $PH_3/H_2$ gases were introduced into the deposition chamber. The mass flow controller was used to adjust the mass flows of the $SiH_4$, $H_2$, and $PH_3/H_2$ gases at 2, 50, and 0.5 sccm, respectively, and the pressure inside the deposition chamber was adjusted to 1.1 Torr. The power of the RF power supply was set at 0.04 $W/cm^2$. The RF power was introduced into the plasma formation cup to cause glow discharge to initiate formation of an RFn type layer on the substrate. When the thickness of the RFn type layer reached 10 nm, the RF power supply was turned off to stop glow discharge to complete the formation of the RFn-type layer of µc-Si.

(2) An RFi type layer 251 comprising a-Si, an MWi type layer 204 comprising a-SiGe, and an RFi type layer 261 comprising a-Si were sequentially formed using an RF plasma CVD method, a microwave plasma CVD method, and an RF plasma CVD method, respectively.

(2-1) To form the RFi-type layer 251, of temperature of the substrate was first set at 350° C. Once the substrate was sufficiently heated, $Si_2H_6$ and $H_2$ gases were allowed to flow into the i-type layer deposition chamber. Each mass flow controller was used to adjust the mass flows of the $Si_2H_6$ and $H_2$ gases at 4 and 100 sccm, respectively. The pressure inside the i-type layer deposition chamber was adjusted to 0.8 Torr. The RF power supply 424 was set at 0.007 $W/cm^2$, and the power was applied to the bias bar to cause glow discharge. The shutter was opened to initiate formation of an i-type layer on the RFn type layer, and the RF glow discharge was stopped when the thickness of the i-type layer reached 10 nm. The output of the RF power supply was turned off to complete the formation of the RFi type layer.

(2-2) To form the MWi type layer 204, the temperature of the substrate was first set at 380° C. Once the substrate was sufficiently heated, $SiH_4$, $GeH_4$, and $H_2$ gases were allowed to flow into the i-type layer deposition chamber. Each mass flow controller was used to adjust the mass flows of the $SiH_4$, $GeH_4$, and $H_2$ gases at 50, 35, and 120 sccm, respectively. The pressure inside the i-type layer deposition chamber was adjusted so as to be 6 m Torr. The RF power supply was set at 0.2 $W/cm^2$, and the power was applied to the bias bar. The power of the microwave power supply was set at 0.1 $W/cm^2$, and the microwave power was introduced into the i-type deposition chamber to cause glow discharge. The shutter was opened to initiate formation of the MWi type layer on the RFi type layer, and the microwave glow discharge was stopped when the thickness of the i-type layer reached 0.1 µm. The output of the bias power supply was turned off to complete the formation of the MWi type layer.

(2-3) To form the RFi-type layer 261, the temperature of the substrate was first set at 250° C. Once the substrate had been sufficiently heated, $Si_2H_6$ and $H_2$ gases were allowed to flow into the i-type layer deposition chamber. Each mass flow controller was used to adjust the mass flows of the $Si_2H_6$ and $H_2$ gases at 2 and 80 sccm, respectively. The pressure inside the i-type layer deposition chamber was adjusted to 0.7 Torr. The RF power supply was set at 0.007 $W/cm_2$, and the power was applied to the bias bar to cause glow discharge. The shutter was opened to initiate formation of the i-type layer on the MWi type layer, and the RF glow discharge was stopped when the thickness of the i-type layer reached 20 nm. The output of the RF power supply was turned off to complete the formation of the RFi type layer.

(2-4) A p-type semiconductor layer 205 comprising µc-Si was formed. The temperature of the substrate was set at 230° C., and when it became stable, $H_2$, $SiH_4/H_2$, and $BF_3/H_2$ gases were introduced into the deposition chamber. The mass flow controller was used to adjust the mass flows of the $H_2$, $SiH_4/H_2$, and $BF_3/H_2$ gases at 50, 0.5, and 0.5 sccm, respectively, and the pressure inside the deposition chamber was adjusted to 2.0 Torr. The power of the RF power supply 423 was set at 0.15 $W/cm^2$. The RF power was introduced into the plasma formation cup to cause glow discharge to initiate formation of a p-type layer comprising µc-Si. When the thickness of the layer reached 10 nm, the RF power supply was turned off to stop glow discharge to complete the formation.

(3) A p-type doped layer was thus formed on the i-type semiconductor layer. Then, to expose the surface of the doped layer to a plasma containing elements for extending the band gap of the doped layer, $CH_4$ and He gases were introduced into the deposition chamber. The mass flow controller was used to adjust the mass flows of the $CH_4$ and He gases at 10 and 30 sccm, respectively, and the pressure inside the deposition chamber was adjusted to 1.0 Torr. The power of the RF power supply was set at 0.06 $W/cm^2$ to introduce RF power into the plasma formation cup to generate glow discharge. The RFp layer was thus exposed to plasma containing a band gap increasing element for 100 seconds to amorphize the surface of the RFp-type layer so that it could become a-SiC. The formation of the p-type layer according to this invention was thus completed and formation of the first pin junction was thus also completed.

A method for producing the second pin junction 215 is described below.

(4) The process for forming the second pin junction 215 was the same as the process for forming the first pin junction 214 except for the conditions for forming an MWi type layer comprising a-SiGe. The difference in the conditions for forming an MWi type layer comprising a-SiGe was that the mass flows of $SiH_4$, $GeH_4$, and $H_2$ gases were maintained at 50, 30, and 120 sccm, respectively. Using these steps, the formation of the second pin junction 215 was finished.

A method for forming the third pin junction 216 is now described according to its procedures. The numbers in parentheses indicate the respective steps.

(5) To form an RFn type layer 209 comprising µc-Si, the substrate heater was first set to heat the substrate to 350° C. Except for this step, an RFn type layer according to this invention was produced in the same manner as the RFn type layer in the second pin junction.

(6) To form an RFi type layer 210, the temperature of the substrate was first set at 200° C. Once the substrate had been sufficiently heated, $Si_2H_6$ and $H_2$ gases were allowed to flow into the i-type layer deposition chamber through the gas introduction pipe 449. Each mass flow controller was used to adjust the mass flows of the $Si_2H_6$ and $H_2$ gases at 2 and 80 sccm, respectively. The pressure inside the i-type layer deposition chamber was adjusted to 0.6 Torr. The RF power supply was set at 0.07 W/cm², and the power was applied to the bias bar to cause glow discharge. The shutter was opened to initiate formation of the RFi-type layer, and the RF glow discharge was stopped when the thickness of the i-type layer reached 120 nm. The output of the RF power supply was turned off to complete the formation of the RFi type layer.

(7) To form a p-type semiconductor layer 211 of µc-Si, the temperature of the substrate was first set at 170° C. Except for this step, the layer was produced in the same manner as the p-type layer in the second pin junction. Using these steps, the formation of the third pin junction 216 was completed.

(8) ITO was vacuum-deposited on the RFp type layer 211 as the transparent conductive layer 212 until its thickness reached 70 mm. A mask with a comb-like pattern of openings therein was then placed thereon, and a vacuum deposition method was used to form a comb-like current collecting electrode 213 comprising Cr (40 nm), Ag (1,000 nm), and Cr (40 nm).

Comparative Example 15-1

This example differs from Example 15 in that after a doped layer was formed on the i-type semiconductor layer, the surface of the doped layer was not exposed to plasma containing a band gap increasing element.

The remaining parts of the process were similar to Example 15.

The photovoltaic device formed according to this example is referred to as SC Comparative Example 15-1.

The results of evaluations conducted in the same way as Example 5 are shown below.

TABLE 25

|  | Photoelectric conversion efficiency (η) | Open circuit voltage ($V_{oc}$) | Short-circuit current ($J_{sc}$) | Fill Factor (F.F.) |
|---|---|---|---|---|
| (SC Example 15) | 1.10 | 1.04 | 1.05 | 1.01 |

Table 25 indicates that the photovoltaic device according to SC Example 15 has better open circuit voltage ($V_{OC}$), short-circuit current ($J_{SC}$) and photoelectric conversion efficiency (η).

Comparative Example 15-2

This example differs from Example 15 in the following three points.

(a) When an RFp type layer was formed, the mass flow controller was used to adjust the mass flows of the $H_2$, $SiH_4/H_2$, $CH_4$, and $BF_3/H_2$ gases at 50, 0.5, 0.1, and 0.5 sccm, respectively, and the pressure inside the deposition chamber was adjusted to 2 Torr.

(b) When an RFp type layer was formed, the power of the RF power supply was set at 0.020 W/cm², and the RF power was introduced into the plasma formation cup to cause glow discharge to initiate formation of a p-type layer of µc-SiC. When the thickness of the layer reached 10 nm, the RF power supply was turned off to stop the glow charge to complete the formation.

(c) After forming a doped layer on the i-type semiconductor layer, the process for exposing the surface of the doped layer to plasma containing elements for increasing the band gap in the doped layer was omitted.

The remaining parts of the process were similar to Example 15.

The photovoltaic device formed according to this example is referred to as SC Comparative Example 15-2.

The results of evaluations conducted in the same way as Example 5 are shown below.

TABLE 26

|  | Photoelectric conversion efficiency (η) | Open circuit voltage ($V_{oc}$) | Short-circuit current ($J_{sc}$) | Fill Factor (F.F.) |
|---|---|---|---|---|
| (SC Example 15) | 1.09 | 1.01 | 1.03 | 1.04 |

Table 26 indicates that the photovoltaic device according to SC Example 15 has better short-circuit current ($J_{SC}$) fill factor (F.F.), and photoelectric conversion efficiency (η).

Table 27 shows the results of an examination of the nonuniformity and dispersion of the open circuit voltage ($V_{OC}$) and the fill factor (F.F.) inside the substrate. In this table, the maximum value in the same substrate is assumed to be 1.

TABLE 27

|  | Open circuit voltage ($V_{oc}$) | Fill Factor (F.F.) |
|---|---|---|
| (SC Example 15) | 0.95–1.00 | 0.97–1.00 |
| (SC Comparative Example 15-2) | 0.90–1.00 | 0.92–1.00 |

Table 27 shows that SC Example 15 has smaller nonuniformity and dispersion and that it can improve the uniformity of the photoelectric conversion characteristic.

The next described series of examples was the same as Examples 11 through 15 except that a plasma containing both a band gap increasing element and a valence electron control agent was used in the process.

Example 16

A photovoltaic device was produced in the same manner as in Example 11 except that 5 sccm of $PH_3/He$ gas was further introduced in step (9).

Comparative Example 16-1

This example differs from Example 16 in that after a doped layer was formed on the i-type semiconductor layer, the surface of the doped layer was not exposed to plasma containing both a band gap increasing element and a valence electron control agent.

The remaining parts of the process was similar to Example 16.

The photovoltaic device formed according to this example is referred to as SC Comparative Example 16-1.

The results of evaluations conducted in the same way as Example 11 are shown below.

TABLE 28

|  | Photoelectric conversion efficiency (η) | Open circuit voltage ($V_{oc}$) | Short-circuit current ($J_{sc}$) | Fill Factor (F.F.) |
|---|---|---|---|---|
| (SC Example 16) | 1.14 | 1.07 | 1.07 | 1.00 |

Table 28 indicates that the photovoltaic device according to SC Example 16 has better open circuit voltage ($V_{OC}$), short-circuit current ($J_{SC}$), and photoelectric conversion efficiency (η).

Comparative Example 16-2

This example differs from Example 16 in the following three points.

(a) When an RFn type layer was formed, the mass flow controller was used to adjust the mass flows of the $SiH_4$, $CH_4$, $H_2$, and $PH_3/H_2$ gases at 2, 0.2, 50, and 0.5 sccm, respectively, and the pressure inside the deposition chamber was adjusted to 1.1 Torr.

(b) When an RFn type layer was formed, the power of the RF power supply was set at 0.025 W/cm$^2$, and the RF power was introduced into the plasma formation cup to cause glow discharge to initiate formation of an RFn type layer on the substrate. An RFn type layer of a-SiC 10 nm in thickness was thus formed.

(c) The process for exposing the surface of the doped layer formed on the i-type semiconductor layer to plasma containing both a band gap increasing element and a valence electron control agent of the same type as the doped layer was omitted.

The remaining parts of the process was similar to Example 16.

The results of evaluations conducted in the same way as in Example 11 are shown below.

TABLE 29

|  | Photoelectric conversion efficiency ($\eta$) | Open circuit voltage ($V_{OC}$) | Short-circuit current ($J_{SC}$) | Fill Factor (F.F.) |
|---|---|---|---|---|
| (SC Example 16) | 1.13 | 1.04 | 1.04 | 1.05 |

Table 29 indicates that the photovoltaic device according to SC Example 16 has a better open circuit voltage ($V_{OC}$) and photoelectric conversion efficiency ($\eta$).

Table 30 shows the results of an examination of the nonuniformity and dispersion of the open circuit voltage ($V_{OC}$) and the fill factor (F.F.) inside the substrate. In this table, the maximum value in the same substrate is assumed to be 1.

TABLE 30

|  | Open circuit voltage ($V_{OC}$) | Fill Factor (F.F.) |
|---|---|---|
| (SC Example 16) | 0.95–1.00 | 0.97–1.00 |
| (SC Comparative Example 16-2) | 0.90–1.00 | 0.92–1.00 |

Table 30 shows that SC Example 16 has smaller nonuniformity and dispersion and that it can improve the uniformity of the photoelectric conversion characteristic.

Example 17

A photovoltaic device was produced in the same manner as in Example 12 except that 5 sccm of $PH_3$/He gas was further introduced in step (d).

Comparative Example 17-1

This example differs from Example 17 in that after a doped layer was formed on the i-type semiconductor layer, the surface of the doped layer was not exposed to plasma containing both a band gap increasing element and a valence electron control agent.

The remaining parts of the process were similar to Example 17.

The photovoltaic device formed according to this example is referred to as SC Comparative Example 17-1.

The results of evaluations conducted in the same way as in Example 12 are shown below.

TABLE 31

|  | Photoelectric conversion efficiency ($\eta$) | Open circuit voltage ($V_{OC}$) | Short-circuit current ($J_{SC}$) | Fill Factor (F.F.) |
|---|---|---|---|---|
| (SC Example 17) | 1.11 | 1.06 | 1.05 | 1.00 |

Table 31 indicates that the photovoltaic device according to SC Example 17 has better open circuit voltage ($V_{OC}$), fill factor (F.F.), and photoelectric conversion efficiency ($\eta$).

Example 18

A photovoltaic device was produced in the same manner as in Example 13 except that 5 sccm of $PH_3$/He gas was further introduced in step (d).

Comparative Example 18-1

This example differs from Example 18 in that after a doped layer was formed on the i-type semiconductor layer, the surface of the doped layer was not exposed to plasma containing both a band gap increasing element and a valence electron control agent.

The remaining parts of the process was similar to Example 18.

The photovoltaic device formed according to this example is referred to as SC Comparative Example 18-1.

The results of evaluations conducted in the same way as in Example 13 are shown below.

TABLE 32

|  | Photoelectric conversion efficiency ($\eta$) | Open circuit voltage ($V_{OC}$) | Short-circuit current ($J_{SC}$) | Fill Factor (F.F.) |
|---|---|---|---|---|
| (SC Example 18) | 1.14 | 1.07 | 1.06 | 1.01 |

Table 32 indicates that the photovoltaic device according to SC Example 18 has better open circuit voltage ($V_{OC}$), short-circuit current ($J_{SC}$), and photoelectric conversion efficiency ($\eta$).

Example 19

A photovoltaic device was produced in the same manner as in Example 14 except that 5 sccm of $PH_3$/He gas was further introduced in step (d).

Comparative Example 19-1

This example differs from Example 19 in that after a doped layer was formed on the i-type semiconductor layer, the surface of the doped layer was not exposed to plasma containing both a band gap increasing element and a valence electron control agent.

The remaining parts of the process were similar to Example 19.

The photovoltaic device formed according to this example is referred to as SC Comparative Example 19-1.

The results of evaluations conducted in the same way as in Example 14 are shown below.

TABLE 33

|  | Photoelectric conversion efficiency (η) | Open circuit voltage ($V_{OC}$) | Short-circuit current ($J_{SC}$) | Fill Factor (F.F.) |
|---|---|---|---|---|
| (SC Example 19) | 1.10 | 1.06 | 1.05 | 0.99 |

Table 33 indicates that the photovoltaic device according to SC Example 19 has better open circuit voltage ($V_{OC}$), short-circuit current ($J_{SC}$), and photoelectric conversion efficiency (η).

Example 20

A photovoltaic device was produced in the same manner as in Example 15 except that 5 sccm of $PH_3$/He gas was further introduced in step (3).

Comparative Example 20-1

This example differs from Example 20 in that after a doped layer was formed on the i-type semiconductor layer, the surface of the doped layer was not exposed to plasma containing both a band gap increasing element and a valence electron control agent.

The remaining parts of the process were similar to Example 20.

The photovoltaic device formed according to this example is referred to as SC Comparative Example 20-1.

The results of evaluations conducted in the same way as in Example 15 are shown below.

TABLE 34

|  | Photoelectric conversion efficiency (η) | Open circuit voltage ($V_{OC}$) | Short-circuit current ($J_{SC}$) | Fill Factor (F.F.) |
|---|---|---|---|---|
| (SC Example 20) | 1.14 | 1.07 | 1.05 | 1.02 |

Table 34 indicates that the photovoltaic device according to SC Example 20 has better open circuit voltage ($V_{OC}$), fill factor (F.F.), and photoelectric conversion efficiency (η).

Comparative Example 20-2

This example differs from Example 20 in the following three points.

(a) When an RFn type layer was formed, the mass flow controller was used to adjust the mass flows of the $SiH_4$, $CH_4$, $H_2$, and $PH_3/H_2$ gases at 2, 0.2, 50, and 0.5 sccm, respectively, and the pressure inside the deposition chamber was adjusted to 1.1 Torr.

(b) When an RFn type layer was formed, the power of the RF power supply was set at 0.025 W/cm$^2$, and the RF power was introduced into the plasma formation cup to cause glow discharge to initiate formation of an RFn type layer on the substrate. An RFn type layer of a-SiC 10 nm in thickness was thus formed.

(c) The process for exposing the surface of the doped layer on the i-type semiconductor layer to plasma containing both a band gap increasing element and a valence electron control agent of the same type as the doped layer was omitted.

The remaining parts of the process were similar to Example 20.

The photovoltaic device formed according to this example is referred to SC Comparative Example 20-2.

The results of evaluations conducted in the same way as in Example 15 are shown below.

TABLE 35

|  | Photoelectric conversion efficiency (η) | Open circuit voltage ($V_{OC}$) | Short-circuit current ($J_{SC}$) | Fill Factor (F.F.) |
|---|---|---|---|---|
| (SC Example 20) | 1.12 | 1.04 | 1.03 | 1.05 |

Table 35 indicates that the photovoltaic device according to SC Example 20 has better open circuit voltage ($V_{OC}$), fill factor (F.F.), and photoelectric conversion efficiency (η).

Table 36 shows the results of an examination of the nonuniformity and dispersion of the open circuit voltage ($V_{OC}$) and the fill factor (F.F.) inside the substrate.

In this table, the maximum value in the same substrate is assumed to be 1.

TABLE 36

|  | Open circuit voltage ($V_{OC}$) | Fill Factor (F.F.) |
|---|---|---|
| (SC Example 20) | 0.95–1.00 | 0.97–1.00 |
| (SC Comparative Example 20-2) | 0.90–1.00 | 0.92–1.00 |

Table 36 shows that SC Example 20 has smaller nonuniformity and dispersion and that it can improve the uniformity of the photoelectric transfer characteristic.

In the next series of examples, the deposition apparatus in FIG. 4 was used to produce a structure shown in FIG. 1C. An i-type semiconductor 104 was formed, and a buffer layer 110 was subsequently formed. Before forming a doped layer, the surface 111 of the buffer layer was exposed to plasma containing a band gap increasing element.

Example 21

This example is the same as Example 1 except that the step (9) of Example 1 for exposing the doped layer to plasma containing a band gap increasing element was not carried out, and that after the formation of an i-type semiconductor layer, the following steps E1 to E5 for forming a buffer layer were inserted into the steps 13 and 14 of Example 1.

(E1) A buffer layer 110 with a thickness of 25 nm was formed in the same manner as the i-type layer 104 except that the temperature of the substrate 490 was set at 280° C.

(E2) After the formation of the buffer layer 110, the valve (not shown) was closed to stop $SiH_4$ gas from flowing into the i-type layer deposition chamber 418. $H_2$ gas was allowed to continuously flow into the i-type layer deposition cheer 418 for two minutes.

(E3) The valve (not shown) was closed to evacuate the inside of the i-type layer deposition chamber 418 and the gas line until the pressure reached $1 \times 10^{-5}$ Torr.

(E4) Before the formation of a doped layer on the i-type semiconductor layer, the valve (not shown) was operated so as to introduce $CH_4$ and He gases into the deposition chamber 418 through the gas introduction pipe 449. The mass flow controller was Used to adjust the mass flows of the $CH_4$ and He gases so that they were 10 and 300 sccm, respectively. The pressure inside the deposition chamber 418 was adjusted to 0.5 Torr. The temperature of the substrate 490 was maintained at 280° C., and the power of the RF power supply 424 was set at 0.08 W/cm². The power was applied to the bias bar 428 to cause glow discharge to expose the substrate to plasma containing γ for 600 seconds. A buffer layer 110 having a-SiC:H on its surface was thus formed.

(E5) After the formation of the buffer layer 109, the valve (not shown) was closed to stop the $CH_4$ and He gases from flowing into the i-type layer deposition chamber 418. $H_2$ gas was then allowed to continuously flow into the i-type layer deposition chamber 418 for two minutes. The valve (not shown) was closed to evacuate the inside of the i-type layer deposition chamber 418 and the gas line until the pressure reached $1\times10^{-5}$ Torr.

Comparative Example 21-1

This example differs from Example 21 in that before forming a doped layer on the i-type semiconductor layer, the surface of the buffer layer was not exposed to plasma containing a band gap increasing element.

The remaining parts of the process were similar to Example 21.

The photovoltaic device formed according to this example is referred to as SC Comparative Example 21-1.

The results of evaluations conducted in the same way as in Example 1 are shown below.

TABLE 37

| | Photoelectric conversion efficiency (η) | Open circuit voltage ($V_{OC}$) | Short-circuit current ($J_{SC}$) | Fill Factor (F.F.) |
|---|---|---|---|---|
| (SC Example 20) | 1.10 | 1.06 | 0.99 | 1.05 |

Table 37 indicates that the photovoltaic device according to SC Example 21 has better open circuit voltage ($V_{OC}$), fill factor (F.F.), and photoelectric conversion efficiency (η).

Comparative Example 21-2

This example differs from Example 21 in the following three points.

(a) When a buffer layer 110 was formed, the mass flow controller was used to adjust the mass flows of the $SiH_4$, $C_2H_2$, and $H_2$ gases at 50, 35, and 120 sccm, respectively, and the pressure inside the deposition chamber was adjusted to 5 mTorr.

(b) Microwave plasma CVD was used to deposit a buffer layer of a-SiC:H 25 nm in thickness.

(c) The process for exposing the surface of the buffer layer to a band gap increasing element before forming a doped layer on the i-type semiconductor layer was omitted.

The remaining parts of the process were similar to Example 21.

The photovoltaic device formed according to this example is referred to as SC Comparative Example 21-2.

The results of evaluations conducted in the same way as in Example 1 are shown below.

TABLE 38

| | Photoelectric conversion efficiency (η) | Open circuit voltage ($V_{OC}$) | Short-circuit current ($J_{SC}$) | Fill Factor (F.F.) |
|---|---|---|---|---|
| (SC Example 21) | 1.09 | 1.03 | 1.02 | 1.04 |

Table 38 indicates that the photovoltaic device according to SC Example 21 has better open circuit voltage ($V_{OC}$), fill factor (F.F.), and photoelectric conversion efficiency (η).

Table 39 shows the results of an examination of the nonuniformity and dispersion of the open circuit voltage ($V_{OC}$) and the fill factor (F.F.) inside the substrate. In this table, the maximum value in the same substrate is assumed to be 1.

TABLE 39

| | Open circuit voltage ($V_{OC}$) | Fill Factor (F.F.) |
|---|---|---|
| (SC Example 21) | 0.97–1.00 | 0.97–1.00 |
| (SC Comparative Example 21-2) | 0.91–1.00 | 0.93–1.00 |

Table 39 shows that SC Example 21 has smaller nonuniformity and dispersion and that it can improve the uniformity of the photoelectric conversion characteristic.

Example 22

This example differs from Example 21 in the conditions for forming an n-type layer of μc-Si, exposing the surface of the buffer layer to plasma, forming an MWi type layer of a-SiGe, and forming a p-type layer of a-SiC, as shown below.

(a) Conditions for forming an n-type layer 103

To form an n-type layer of μc-Si (an n-type layer formed by the RF plasma CVD method), the substrate 490 was first transferred into the deposition cheer 417, as in Example 1. The mass flow controller was used to adjust the mass flows of the $SiH_4/H_2$, $H_2$, and $PH_3/H_2$ gases at 4, 100, and 1 sccm, respectively, and the pressure inside the deposition chamber was adjusted to 0.5 Torr.

The substrate heater was set to heat the substrate to 380° C., and when the temperature of the substrate became stable, the power of the RF power supply was set at 0.04 W/cm². The RF power was introduced into the plasma formation cup to cause glow discharge to initiate formation of an n-type layer on the substrate. An n-type layer 10 nm in thickness was thus formed.

(b) Conditions for forming an MWi type layer 104

An MWi type layer (an i-type semiconductor layer formed by the microwave CVD method) was then formed using a-SiGe. The substrate heater was set to heat the substrate to 380° C., and once the substrate was sufficiently heated, the valve (not shown) was opened slowly to introduce $SiH_4$, $GeH_4$, and $H_2$ gases into the i-type layer deposition chamber through the gas introduction pipe. The mass flow controller (not shown) was used to adjust the mass flows of the $SiH_4$, $GeH_4$, and $H_2$ gases at 50, 35, and 120 scam, respectively. The pressure inside the i-type layer deposition chamber was adjusted to 6 m Torr by opening the conductance valve (not shown). The RF power supply was then set at 0.2 W/cm², and the power was applied to the bias bar. The power of the microwave power supply (not shown) was set at 0.1 W/cm², and the microwave power was introduced into the i-type layer deposition chamber to cause glow discharge. The shutter was opened to initiate formation of an MWi type layer, and when the thickness of the i-type layer reached 0.1 µm, the microwave glow discharge was stopped to finish the formation of the MWi layer.

(c) Conditions for forming a buffer layer 110

As in Example 1, a buffer layer comprising a-Si was formed to a thickness of 25 nm.

To expose the surface of the doped layer to plasma containing a band gap increasing element before forming a p-type semiconductor layer on the i-type semiconductor layer, the valve (not shown) was operated so as to introduce CH$_4$ and He gases into the deposition chamber 418 through the gas introduction pipe 449. BF$_3$ gas which had been diluted with H$_2$ to a concentration of 1,000 ppm was also introduced to introduce a small amount of boron into the buffer layer. The mass flow controller was used to adjust the mass flows of the CH$_4$ gas, the BF$_3$ gas diluted with H$_2$ to a concentration of 1,000 ppm, and the He gas so that they were 10, 1, and 300 sccm, respectively, and the pressure inside the deposition chamber 418 was adjusted to 1.0 Torr. The temperature of the substrate 490 was maintained at 280° C., and the power of the RF power supply 424 was set at 0.06 W/cm$^2$. The RF power was introduced into the bias bar 428 to cause glow discharge to expose the substrate to plasma containing a band gap increasing element for 150 seconds. Only the vicinity of the surface of the buffer layer of deposited a-Si thus became a-SiC:H. As a result, a buffer layer 110/111 according to this invention was produced.

(d) Conditions for forming a p-type semiconductor layer 105

A p-type semiconductor layer 105 of a-SiC was then formed. The substrate 490 was first transferred into the p-type layer deposition chamber 419, as in Example 1. The substrate heater 412 was set to heat the substrate to 230° C., and when the temperature of the substrate became stable, the mass flow controller (not shown) was used to adjust the mass flows of the H$_2$, SiH$_4$, C$_2$H$_2$, and BF$_3$H$_2$ gases at 50, 2, 2, and 4 sccm, respectively. The pressure inside the deposition chamber 419 was adjusted to 2.0 Torr by opening the conductance valve (not shown). The RF power supply was then set at 0.03 W/cm$^2$, the RF power was introduced into the plasma formation cup 421 to cause glow discharge to initiate formation of a p-type layer of a-SiC. When the thickness of the p-type layer reached 10 nm, the glow discharge was stopped to complete the formation of the p-type semiconductor layer 105 of a-SiC.

The remaining parts of the process were similar to Example 21.

Comparative Example 22-1

This example differs from Example 22 in that before forming a doped layer on the i-type semiconductor layer, the surface of the buffer layer was not exposed to plasma containing a band gap increasing element.

The remaining parts of the process were similar to Example 22.

The photovoltaic device formed according to this example is referred to as SC Comparative Example 22-1.

The results of evaluations conducted in the same way as in Example 2 are shown below.

TABLE 40

|  | Photoelectric conversion efficiency (η) | Open circuit voltage (V$_{OC}$) | Short-circuit current (J$_{SC}$) | Fill Factor (F.F.) |
|---|---|---|---|---|
| (SC Example 22) | 1.12 | 1.06 | 1.01 | 1.05 |

Table 40 indicates that the photovoltaic device according to SC Example 22 has better open circuit voltage (V$_{OC}$), fill factor (F.F.), and photoelectric conversion efficiency (η).

Example 23

This example differs from Example 21 in the conditions for forming an n-type layer of a-Si, an MWi type layer of a-SiC, a p-type semiconductor layer of µc-SiCN, and a buffer layer, as shown below.

(a) Conditions for forming an n-type layer 103

To form an n-type layer of a-SiC (an n-type semiconductor layer formed by the RF plasma CVD method), the mass flow controller was used to adjust the mass flows of an SiH$_4$/H$_2$, C$_2$H$_2$, H$_2$, and PH$_3$/H$_2$ gases at 2, 2, 50, and 1 sccm, respectively, and the pressure inside the deposition chamber 417 was adjusted to 1.1 Torr. The substrate heater was set to heat the substrate to 380° C., and when the temperature of the substrate became stable, the power of the RF power supply was set at 0.03 W/cm$^2$. The RF power was introduced into the plasma formation cup to cause glow discharge to initiate formation of an n-type layer on the substrate. An n-type layer 10 nm in thickness was thus formed.

(b) Conditions for forming an MWi layer 104

An MWi type layer was formed using a-SiC. To form an MWi type layer, the substrate heater was set to heat the substrate to 380° C., and once the substrate was sufficiently heated, the valve (not shown) was opened slowly to introduce Sih$_4$, C$_2$H$_2$, and H$_2$ gases into the i-type layer deposition chamber 418. Each mass flow controller (not shown) was used to adjust the mass flows of the SiH$_4$, C$_2$H$_2$, and H$_2$ gases at 50, 35, and 120 sccm, respectively. The pressure inside the i-type layer deposition chamber 418 was adjusted to 6 mTorr. The RF power supply was then set at 0.2 W/cm$^2$, and the power was applied to the bias bar. The power of the microwave power supply (not shown) was subsequently set at 0.1 W/cm$^2$, and the microwave power was introduced into the i-type layer deposition cheer to cause glow discharge. The shutter was opened to initiate formation of an MWi type layer, and when the thickness of the i-type layer reached 0.1 µm, the microwave glow discharge was stopped to finish the formation of the MWi layer.

(c) Conditions for forming a buffer layer 110

The flows of the SiH$_4$ and C$_2$H$_2$ gases were maintained at 40 and 60 sccm, respectively, and the temperature of the substrate was maintained at 300° C. to form a buffer layer of a-Si with a band gap larger than that in the i-type layer formed in (b) (in the same manner as (b)) so as to have a thickness of 20 nm.

To expose the surface of the buffer layer to plasma containing a band gap increasing element before forming a doped layer on the i-type semiconductor layer, the valve (not shown) was operated so as to introduce NH$_3$ and H$_2$ gases into the deposition chamber 418 through the gas introduction pipe 449. The mass flow controller was used to adjust the mass flows of the NH$_3$ and H$_2$ gases at 10 and 500 sccm, respectively, and the pressure inside the deposition chamber 418 was adjusted to 1.5 Torr. The temperature of the substrate 490 was maintained at 280° C., and the power of the RF power supply 424 was set at 0.1 W/cm². The RF power was introduced into the bias bar 428 to cause glow discharge to expose the substrate to plasma containing a band gap increasing element for 120 seconds. Only the vicinity of the surface of the buffer layer of deposited a-Si thus became μc-SiCN:H. As a result, a buffer layer 110/111 according to this invention was produced.

(d) Conditions for forming a p-type semiconductor layer 105

A p-type semiconductor layer 105 of μc-SiCN was then formed. The temperature of the substrate was 230° C. The mass flow controller (not shown) was used to adjust the mass flows of the $H_2$, $SiH_4/H_2$, $C_2H_2$, and $NH_3$ gases at 50, 1, 2, and 3 sccm, respectively. The pressure inside the deposition cheer 419 was adjusted to 2.0 Torr by opening the conductance valve (not shown). The power of the RF power supply 423 was then set at 0.15 W/cm², the RF power was introduced into the plasma formation cup 421 to cause glow discharge to initiate formation of a p-type layer of μc-SiCN. When the thickness of the p-type layer reached 10 nm, the glow discharge was stopped to complete the formation.

The remaining parts of the process were similar to Example 21.

Comparative Example 23-1

This example differs from Example 23 in that before forming a doped layer on the i-type semiconductor layer, the surface of the buffer layer was not exposed to a plasma containing a band gap increasing element.

The remaining parts of the process were similar to Example 23.

The photovoltaic device formed according to this example is referred to as SC Comparative Example 23-1.

The results of evaluations conducted in the same way as in Example 3 are shown below.

TABLE 41

| | Photoelectric conversion efficiency (η) | Open circuit voltage ($V_{OC}$) | Short-circuit current ($J_{SC}$) | Fill Factor (F.F.) |
|---|---|---|---|---|
| (SC Example 23) | 1.08 | 1.04 | 1.00 | 1.04 |

Table 41 indicates that the photovoltaic device according to SC Example 23 has better open circuit voltage ($V_{OC}$), fill factor (F.F.), and photoelectric conversion efficiency (η).

Example 24

This example differs from Example 21 in that an (n) layer is disposed on the light incidence side instead of a (p) layer and that the layers are constituted in the order of a substrate, a (p) layer, an (i) layer, and an (n) layer instead of a substrate, an (n) layer, an (i) layer, and a (p) layer.

Described below are the conditions for forming a p-type layer of a-Si, forming an i-type layer of a-SiC, forming a buffer layer according to this invention which comprises a-SiO only in its upper part, and forming an i-type layer of a-SiO to complete a photovoltaic device according to this invention.

(a) Conditions for forming a p-type layer 103

A p-type layer was deposited using an RF plasma CVD method so that it was formed as a-Si. The substrate heater was set to heat the substrate to 350° C., and when the temperature of the substrate became stable, $H_2$, $SiH_4$ and $BF_3/H_2$ gases were introduced into the deposition chamber 419. The mass flow controller was used to adjust the mass flows of the $H_2$, $SiH_4$, and $BF_3/H_2$ gases at 30, 2, and 5 sccm, respectively, and the pressure inside the deposition cheer 419 was adjusted to 2.0 Torr. The power of the RF power supply was set at 0.05 W/cm². The RF power was introduced into the plasma formation cup to cause glow discharge to initiate formation of a p-type layer. When the thickness of the p-type layer reached 10 nm, the RF power supply was turned off to stop glow discharge to complete the formation of the p-type layer.

(b) Conditions for forming an MWi type layer 104

An MWi type layer (an i-type semiconductor layer formed by the microwave CVD method) was formed under the same conditions as in Example 21.

(c) Conditions for forming a buffer layer 110

Except that the temperature of the substrate was maintained at 300° C., a buffer layer 110 of a-Si:H with a band gap larger than that in the i-type layer formed in (b) was formed in the same manner as in (b) so as to have a thickness of 25 nm.

To expose the surface of the buffer layer to plasma containing a band gap increasing element before forming an n-type doped layer, $O_2$/He gas was introduced into the deposition chamber 418. The flow controller was used to adjust the mass flow of the $O_2$/He gas at 300 sccm, and the pressure inside the deposition chamber 418 was adjusted to 0.5 Torr. The power of the RF power supply was set at 0.06 W/cm². The RF power was introduced into the plasma formation cup to cause glow discharge to expose the substrate to plasma containing γ for 100 seconds. Only the vicinity 111 of the surface of the buffer layer 110 of deposited a-Si:H thus became a-SiO. As a result, a buffer layer 110/111 according to this invention was produced.

(d) Conditions for forming an n-type layer 105

To produce an n-type layer 105, the substrate heater was set to heat the substrate to 230° C., and when the temperature of the substrate became stable, $H_2$, $SiH_4$, $O_2$/He, and $PH_3/H_2$ gases were introduced into the i-type layer deposition chamber 417. The mass flow controller was used to adjust the flows of the $H_2$, $SiH_4$, $O_2$/He, and $PH_3/H_2$ gases at 50, 2, 4, and 0.5 sccm, respectively, and the pressure inside the deposition chamber was adjusted to 1.0 mTorr. The power of the RF power supply was then set at 0.005 W/cm². The RF power was introduced into the plasma formation cup to cause glow discharge to initiate formation of an n-type layer. When the thickness of the n-type layer reached 10 nm, the RF power supply was turned off to stop glow discharge to complete the formation of the n-type layer.

The remaining parts of the process were similar to Example 21.

Comparative Example 24-1

This example differs from Example 24 in that before a doped layer was formed on the i-type semiconductor layer, the surface of the buffer layer was not exposed to plasma containing a band gap increasing element.

The remaining parts of the process were similar to Example 24.

The photovoltaic device formed according to this example is referred to as SC Comparative Example 24-1.

The results of evaluations conducted in the same way as in Example 4 are shown below.

TABLE 42

| | Photoelectric conversion efficiency (η) | Release voltage ($V_{OC}$) | Short-circuit current ($J_{SC}$) | Fill Factor (F.F.) |
|---|---|---|---|---|
| (SC Example 24) | 1.08 | 1.06 | 0.98 | 1.04 |

Table 42 indicates that the photovoltaic device according to SC Example 24 has better open circuit voltage ($V_{OC}$), fill factor (F.F.), and photoelectric conversion efficiency (η).

Example 25

This example differs from Example 21 in that a triple-cell type photovoltaic device (a tandem stacked cell type comprising a structure formed by depositing a pin type semiconductor junction three times) shown in FIG. 2B was produced instead of the single-cell type photovoltaic device shown in FIG. 1A.

The photovoltaic device according to this example was made using the deposition apparatus shown in FIG. 4.

The layers of the photovoltaic device according to this example were in the order of a substrate 201, a back electrode 202, a first pin junction 214, a second pin junction 215, a third pin junction 216, a transparent electrode 212, and a current collecting electrode 213.

The constitution of the layers in each pin junction according to this example is described below.

The first pin junction 214 comprises an n-type layer (an n1 layer) 203 of μc-Si, a buffer layer 251 of a-Si, an MWi type layer (an i1 layer) 204 of a-SiGe, a buffer layer 261 comprising a-SiC in its upper part and a-Si in its lower part according to this invention, and a p-type layer (a p1 layer) 205 of μc-Si in this order relative to the back electrode 202.

The second pin junction 215 comprises an n-type layer (an n2 layer) 206 of μc-Si, a buffer layer 252 of a-Si, an MWi type layer (an i2 layer) 207 of a-SiGe, a buffer layer 262 comprising a-SiC in its upper part and a-Si in its lower part according to this invention, and a p-type layer (a p2 layer) 208 of μc-Si in this order relative to the first pin junction 214.

The third pin junction 216 comprises an n-type layer (an n3 layer) 209 of μc-Si, an RFi layer 210 of a-Si, a buffer layer 263 comprising μc-SiC in its upper part and a-Si in its lower part according to this invention, and a p-type layer (a p3 layer) 211 of μc-SiC in this order relative to the second pin junction 215.

A method for forming a first pin junction 214 is described according to its procedures. The numbers in parentheses indicate the respective steps.

(1) To form an n-type layer 203 comprising μc-Si, the substrate heater was set to heat the substrate to 380° C., and $SiH_4/H_2$, $PH_3/H_2$, and $H_2$ gases were introduced into the deposition chamber 417. The mass flow controller was used to adjust the mass flows of the $SiH_4/H_2$, $PH_3/H_2$, and $H_2$ gases at 2, 1, and 50 sccm, respectively, and the pressure inside the deposition chamber was adjusted to 1.1 Torr. The power of the RF power supply 422 was set at 0.08 W/cm². The RF power was introduced into the plasma formation cup to cause glow discharge to initiate formation of an n-type layer of μc-Si on the substrate. When the thickness of the n-type layer reached 10 nm, the RF power supply was turned off to stop glow discharge to complete the formation of the n-type layer of μc-Si.

(2) A buffer layer 251 comprising a-Si, an MWi type layer 204 comprising a-SiGe, and a buffer layer 261 comprising a-Si were sequentially formed using an RF plasma CVD method, a microwave plasma CVD method, and an RF plasma CVD method, respectively.

(2-1) To form buffer layer 251 of a-Si, the temperature of the substrate was first set at 350° C. Once the substrate was sufficiently heated, $Si_2H_6$ and $H_2$ gases were allowed to flow into the deposition chamber 417. Each mass flow controller was used to adjust the mass flows of the $Si_2H_6$ and $H_2$ gases at 4 and 100 sccm, respectively. The pressure inside the deposition chamber 417 was adjusted to 0.8 Torr. The RF power supply 422 was set at 0.007 W/cm², and the RF power was introduced into the plasma formation cup to cause glow discharge. The shutter was opened to initiate formation of the buffer layer on the n-type layer, and the RF glow discharge was stopped when the thickness of the buffer layer reached 10 nm. The output of the RF power supply was turned off to complete the formation of the buffer layer.

(2-2) To form an MWi type layer 204, the temperature of the substrate was first set at 380° C. Once the substrate was sufficiently heated, $SiH_4$, $GeH_4$, and $H_2$ gases were allowed to flow into the i-type layer deposition chamber 418. Each mass flow controller was used to adjust the flows of the $SiH_4$, $GeH_4$, and $H_2$ gases at 50, 35, and 120 sccm, respectively. The pressure inside the i-type layer deposition chamber 418 was adjusted to 6 mTorr. The RF power supply was set at 0.2 W/cm², and the power was applied to the bias bar. The power of the microwave power supply was subsequently set at 0.1 W/cm², and the microwave power was introduced into the i-type layer deposition chamber to cause glow discharge. The shutter was opened to initiate formation of the MWi type layer on the RFi type buffer layer 251, and the microwave glow discharge was stopped when the thickness of the i-type layer 204 reached 0.1 μm. The output of the bias power supply was turned off to complete the formation of the MWi type layer.

(2-3) A buffer layer 261 of a-Si was subsequently deposited. The temperature of the substrate was first set at 300° C., and once the substrate was sufficiently heated, $Si_2H_6$ and $H_2$ gases were allowed to flow into the deposition chamber 419. Each mass flow controller was used to adjust the flows of the $Si_2H_6$ and $H_2$ gases at 2 and 80 sccm, respectively. The pressure inside the deposition chamber 419 was adjusted to 0.7 Torr. The RF power supply was then set at 0.007 W/cm², and the RF power was introduced into the plasma formation cup to cause glow discharge. The shutter was opened to initiate formation of the buffer layer 261, and the RF glow discharge was stopped when the thickness of the buffer layer reached 25 nm. The output of the RF power supply was turned off to complete the formation of the buffer layer.

(2-4) To expose the surface of the buffer layer 261 to a plasma containing a band gap increasing element before forming a p-type semiconductor layer 205, $CH_4$ and He gases were introduced into the deposition chamber 419. The mass flow controller was used to adjust the flows of the $CH_4$ and He gases at 1 and 30 sccm, respectively, and the pressure inside the deposition chamber 419 was adjusted to 1.0 Torr. The power of the RF power supply was set at 0.06 W/cm². The RF power was introduced into the plasma formation cup to cause glow discharge to expose the buffer layer to a plasma containing a band gap increasing element for 150 seconds. A buffer layer 261 with its surface comprising a-SiC was thus produced.

(3) A p-type semiconductor layer 205 comprising μc-Si was then formed. The temperature of the substrate was set at 230° C., and when it became stable, $H_2$, $SiH_4/H_2$, and $BF_3/H_2$ gases were introduced into the deposition chamber 419. The mass flow controller was used to adjust the mass flows of the $H_2$, $SiH_4/H_2$, and $BF_3/H_2$ gases at 50, 0.5, and 0.5 sccm, respectively, and the pressure inside the deposition chamber was adjusted to 2.0 Torr. The power of the RF power supply was set at 0.15 W/cm².

The RF power was introduced into the plasma formation cup to cause glow discharge to initiate formation of a p type layer comprising μc-Si. When the thickness of the layer reached 7 nm, the RF power supply was turned off to stop glow discharge to complete the formation. Using these steps, the formation of the first pin junction was completed.

A method for producing a second pin junction 215 is described below.

(4) The process for forming the second pin junction 215 was the same as the process for forming the first pin junction 214 except for the conditions for forming an MWi type layer comprising a-SiGe. The difference in the conditions for forming an MWi type layer comprising a-SiGe was that the mass flows of $SiH_4$, $GeH_4$, and $H_2$ gases were maintained at 50, 30, and 120 sccm, respectively. Using these steps, the formation of the second pin junction 215 was completed.

A method for forming the third pin junction 216 is now described according to its procedures. The numbers in parentheses indicate the respective steps.

(5) To form an n-type layer 209 comprising μc-Si, the substrate heater was first set to heat the substrate to 320° C. Except for this step, this n-type layer was produced in the same manner as the e-type layer in the second pin junction 215.

(6) An i-type layer 210 was then produced using the RF plasma CVD method. The temperature of the substrate was first set at 200° C., and once the substrate was sufficiently heated, $Si_2H_6$ and $H_2$ gases were allowed to flow into the i-type layer deposition chamber 418 through the gas introduction pipe 449. Each mass flow controller was used to adjust the flows of the $Si_2H_6$ and $H_2$ gases at 8 and 300 sccm, respectively. The pressure inside the i-type layer deposition chamber 418 was adjusted to 0.6 Torr. The RF power supply was then set at 0.01 W/cm², and the power was applied to the bias bar to cause glow discharge. The shutter was opened to initiate formation of an i-type layer, and the RF glow discharge was stopped when the thickness of the i-type layer reached 95 nm. The output of the RF power supply was turned off to complete the formation of the i-type layer 210.

(7) A buffer layer 263 of a-Si was produced in the same manner as the buffer layer 261 except that the temperature of the substrate was set at 200° C.

(8) To expose the surface of the buffer layer to a plasma containing a band gap increasing element before forming a p-type semiconductor layer 211, $CH_4$ and $H_2$ gases were introduced into the deposition chamber 419. The mass flow controller was used to adjust the mass flows of the $CH_4$ and $H_2$ gases at 1 and 30 sccm, respectively, and the pressure inside the deposition chamber 419 was adjusted to 1.0 Torr. The power of the RF power supply was set at 0.06 W/cm². The RF power was introduced into the plasma formation cup to cause glow discharge to expose the buffer layer to plasma containing a band gap increasing element for 100 seconds. A buffer layer 263 with its surface comprising μc-SiC was thus produced.

(9) To form a p-type semiconductor layer 211 comprising μc-Si, the temperature of the substrate was first set at 170° C. The mass flows of the $H_2$, $SiH_4/H_2$, $C_2/H_2$, and $BF_3/H_2$ gases were adjusted to 50, 0.5, 1, and 0.5 sccm, respectively. Except for this step, a p-type semiconductor layer 211 of 4 nm thick μc-Si was produced in the same manner as the p-type layer in the second and third pin junctions. Using these steps, the formation of the third pin junction 216 was completed.

(10) ITO was then vacuum-deposited on the p-type layer 211 as the transparent conductive layer 212 until its thickness reached 70 mm. A mask with a comb-like pattern of openings therein was then placed thereon, and a vacuum deposition method was used to form a comb-like current collecting electrode 213 comprising Cr (40 nary), Ag (1,000 nm), and Cr (40 nm).

Comparative Example 25-1

This example differs from Example 25 in that before forming an i-type semiconductor layer on the p-type semiconductor layer, the surface of the buffer layer was not exposed to a plasma containing a band gap increasing element.

The remaining parts of the process were similar to Example 25.

The photovoltaic device formed according to this example is referred to as SC Comparative Example 25-1.

The results of evaluations conducted in the same way as in Example 5 are shown below.

TABLE 43

| | Photoelectric conversion efficiency (η) | Open circuit voltage ($V_{OC}$) | Short-circuit current ($J_{SC}$) | Fill Factor (F.F.) |
|---|---|---|---|---|
| (SC Example 25) | 1.11 | 1.07 | 1.00 | 1.04 |

Table 43 indicates that the photovoltaic device according to SC Example 25 has better open circuit voltage ($V_{OC}$), fill factor (F.F.), and photoelectric conversion efficiency (η).

Comparative Example 25-2

This example differs from Example 25 in the following three points.

(a) When buffer layers 261, 262, and 263 were formed, the mass flow controller was used to adjust the mass flows of the $SiH_4/H_2$, $C_2H_2$, and $H_2$ gases at 2, 2, and 50 sccm, respectively, and the pressure inside the deposition cheer was adjusted to 1.1 Torr.

(b) When buffer layers 261, 262, and 263 were formed, the power of the RF power supply was set at 0.03 W/cm².

(c) The process for exposing the surface of the buffer layer to a plasma containing a band gap increasing element before forming a p-type semiconductor layer on the i-type semiconductor layer was omitted.

The remaining parts of the process were similar to Example 25.

The results of evaluations conducted in the same way as in Example 5 are shown below.

TABLE 44

| | Photoelectric conversion efficiency (η) | Open circuit voltage ($V_{OC}$) | Short-circuit current ($J_{SC}$) | Fill Factor (F.F.) |
|---|---|---|---|---|
| (SC Example 25) | 1.10 | 1.04 | 1.01 | 1.05 |

Table 44 indicates that the photovoltaic device according to SC Example 25 has better open circuit voltage ($V_{OC}$), fill factor (F.F.), and photoelectric conversion efficiency (η).

Table 45 shows the results of an examination of the nonuniformity and dispersion of the open circuit voltage ($V_{OC}$) and the fill factor (F.F.) inside the substrate. In this table, the maximum value in the same substrate is assumed to be 1.

TABLE 45

|  | Open circuit voltage ($V_{oc}$) | Fill Factor (F.F.) |
| --- | --- | --- |
| (SC Example 25) | 0.97–1.00 | 0.98–1.00 |
| (SC Comparative Example 25-2) | 0.92–1.00 | 0.94–1.00 |

Table 45 shows that SC Example 25 has smaller nonuniformity and dispersion and that it can improve the uniformity of the photoelectric conversion characteristic.

Example 26

This example is the same as the triple-cell type photovoltaic device in Example 25 except that the doped layer also had its surface processed using plasma containing a band gap increasing element. That is, the surfaces of an n-type layer, a p-type layer and a buffer layer are plasma-treated.

A method for making a first pin junction 214 is described below.

(1) An n-type layer 203 of μc-Si was formed in the same manner as step (1) in Example 25.

(2) To expose the surface of the doped layer to plasma containing a band gap increasing element before forming an i-type doped layer, $CH_4$ and He gases were introduced into the deposition chamber.

The mass flow controller was used to adjust the flows of the $CH_4$ and He gases at 10 and 30 sccm, respectively, and the pressure inside the deposition chamber was adjusted to 1.0 Torr. The power of the RF power supply was set at 0.06 W/cm². The RF power was introduced into the plasma formation cup to cause glow discharge to expose the substrate to plasma containing α for 100 seconds. The surface of the RFn type layer was thus amorphized to become a-SiC. As a result, formation of the n-type layer according to this invention was completed.

(3) A buffer layer 251 comprising a-Si, an MWi type layer 204 comprising a-SiGe, and a buffer layer 261 comprising a-Si were sequentially formed using an RF plasma CVD method, a microwave plasma CVD method, and an RF plasma CVD method.

The surface of the buffer layer was exposed to a plasma containing a band gap increasing element, that is, $CH_4$.

(4) A p-type layer 205 of μc-Si was formed as in step (3) in Example 25.

(5) The surface of the p-type layer 205 was exposed to a plasma containing a band gap increasing element, that is, $CH_4$, as in step (2).

The second pin junction 215 is described below.

(6) A second pin junction 215 was formed in the same manner as the first pin junction 214 except that in forming an MWi layer 207, the mass flows of $SiH_4$, $GeH_4$, and $H_2$ gases were maintained at 50, 30, and 120 sccm, respectively.

The third pin junction 216 is described below.

(7) An n-type layer 209 of μc-Si was formed as in step (5) in Example 25.

(8) The surface of the n-type layer 209 was exposed to plasma containing a band gap increasing element as in step (2).

(9) A buffer layer 263 of a-Si was formed as in steps (6) and (7) in Example 25.

(10) The surface of the buffer layer 263 was exposed to a plasma containing a band gap increasing element as in step (8) in Example 25.

(11) A p-type layer 211 of μc-SiC was formed as in step (9) in Example 25.

(12) The surface of the p-type layer 211 was exposed to a plasma containing a band gap increasing element as in step (2).

(13) A transparent conductive layer 212 and a current-collecting electrode 213 were formed as in step (10) in Example 25.

The results of evaluations conducted using Example 25 as a reference are shown below.

TABLE 46

|  | Photoelectric conversion efficiency (η) | Open circuit voltage ($V_{oc}$) | Short-circuit current ($J_{sc}$) | Fill Factor (F.F.) |
| --- | --- | --- | --- | --- |
| (SC Example 26) | 1.02 | 1.02 | 1.01 | 1.02 |

Table 46 indicates that SC Example 26 has good characteristics.

What is claimed is:

1. A photovoltaic device having a pin type semiconductor junction structure in which a p-type doped semiconductor layer and an n-type doped semiconductor layer are laminated with an interposed i-type semiconductor layer, comprising at least one doped layer of non-monocrystal semiconductor disposed under and/or over the i-type semiconductor layer, wherein the at least one doped layer has a surface that has been exposed to a plasma containing a band gap increasing element.

2. A photovoltaic device according to claim 1 wherein the band gap increasing element is selected from the group consisting of carbon, nitrogen, and oxygen.

3. A photovoltaic device according to claim 1 wherein the plasma further contains a valence electron control agent.

4. A photovoltaic device according to claim 3 wherein the valence electron control agent comprises a group III element.

5. A photovoltaic device according to claim 3 wherein the valence electron control agent comprises a group V element.

6. A photovoltaic device according to claim 1 wherein the doped layer located at the light receiving side is p-type.

7. A photovoltaic device according to claim 1 wherein the doped layer located at the light receiving side is n-type.

8. A photovoltaic device according to claim 1 wherein a plurality of the pin junctions are tandem stacked.

9. A photovoltaic device according to claim 1 wherein two of the pin junctions are tandem stacked.

10. A photovoltaic device according to claim 1 wherein three of the pin junctions are tandem stacked.

11. A photovoltaic device according to claim 1 wherein the amount of the band gap increasing element contained in the at least one doped layer varies in the layer thickness direction.

12. A photovoltaic device according to claim 1 wherein the at least one doped layer is partly microcrystallized or polycrystallized in the layer thickness direction.

13. A photovoltaic device according to claim 1 wherein the i-type semiconductor layer contains hydrogen atoms and/or halogen atoms.

14. A photovoltaic device according to claim 13 wherein the content of the hydrogen atoms and/or halogen atoms is larger in the vicinity of interface between the i-type semiconductor layer and the at least one doped layer.

15. A photovoltaic device according to claim 1 wherein the at least one doped layer is amorphous.

16. A photovoltaic device according to claim 1 wherein the at least one doped layer is microcrystalline.

17. A photovoltaic device according to claim 1 wherein the at least one doped layer is polycrystalline.

18. A photovoltaic device according to claim 1 wherein the i-type semiconductor layer is amorphous.

19. A photovoltaic device according to claim 1 wherein the i-type semiconductor layer is microcrystalline.

20. A photovoltaic device according to claim 1 wherein the i-type semiconductor layer is polycrystalline.

21. A photovoltaic device having a pin type semiconductor junction structure in which a p-type doped semiconductor layer and an n-type doped semiconductor layer are laminated with an interposed i-type semiconductor layer, comprising:
   at least one doped layer of non-monocrystal semiconductor disposed under and/or over the i-type semiconductor layer; and
   a buffer layer disposed between the i-type semiconductor layer and the at least one doped layer, wherein the buffer layer has a surface exposed to a plasma containing a band gap increasing element.

22. A photovoltaic device according to claim 21 wherein the band gap increasing element is selected from the group consisting of carbon, nitrogen, and oxygen.

23. A photovoltaic device according to claim 21 wherein the doped layer located at the light receiving side is p-type.

24. A photovoltaic device according to claim 21 wherein the doped layer located at the light receiving side is n-type.

25. A photovoltaic device according to claim 21 wherein a plurality of the pin junctions are tandem stacked.

26. A photovoltaic device according to claim 21 wherein two of the pin junctions are tandem stacked.

27. A photovoltaic device according to claim 21 wherein three of the pin junctions are tandem stacked.

28. A photovoltaic device according to claim 21 wherein the amount of the band gap increasing element contained in the buffer layer varies in the layer thickness direction.

29. A photovoltaic device according to claim 21 wherein the buffer layer is partly microcrystallized or polycrystallized in the layer thickness direction.

30. A photovoltaic device according to claim 21 wherein the i-type semiconductor layer contains hydrogen atoms and/or halogen atoms.

31. A photovoltaic device according to claim 30 wherein the content of the hydrogen atoms and/or halogen atoms is larger in the vicinity of the interface between the i-type semiconductor layer and the at least one doped layer.

32. A photovoltaic device according to claim 21 wherein the at least one doped layer is amorphous.

33. A photovoltaic device according to claim 21 wherein the at least one doped layer is microcrystalline.

34. A photovoltaic device according to claim 21 wherein the at least one doped layer is polycrystalline.

35. A photovoltaic device according to claim 21 wherein the i-type semiconductor layer is amorphous.

36. A photovoltaic device according to claim 21 wherein the i-type semiconductor layer is microcrystalline.

37. A photovoltaic device according to claim 21 wherein the i-type semiconductor layer is polycrystalline.

38. A semiconductor device having a pin type semiconductor junction structure in which a p-type doped semiconductor layer and an n-type doped semiconductor layer are laminated with an interposed i-type semiconductor layer, comprising at least one doped layer of non-monocrystal semiconductor disposed under and/or over the i-type semiconductor layer, wherein the at least one doped layer has a surface exposed to a plasma containing a band gap increasing element.

39. A semiconductor device according to claim 38 wherein the band gap increasing element is selected from the group consisting of carbon, nitrogen, and oxygen.

40. A semiconductor device according to claim 38 wherein the plasma further contains a valence electron control agent.

41. A semiconductor device according to claim 40 wherein the valence electron control agent comprises a group III element.

42. A semiconductor device according to claim 40 wherein the valence electron control agent comprises a group V element.

43. A semiconductor device according to claim 38 wherein the doped layer located at the light receiving side is p-type.

44. A semiconductor device according to claim 38 wherein the doped layer located at the light receiving side is n-type.

45. A semiconductor device according to claim 38 wherein a plurality of the pin junctions are tandem stacked.

46. A semiconductor device according to claim 38 wherein two of the pin junctions are tandem stacked.

47. A semiconductor device according to claim 38 wherein three of the pin junctions are tandem stacked.

48. A semiconductor device according to claim 38 wherein the amount of the band gap increasing element contained in the at least one doped layer varies in the layer thickness direction.

49. A semiconductor device according to claim 38 wherein the at least one doped layer is partly microcrystallized or polycrystallized in the layer thickness direction.

50. A semiconductor device according to claim 38 wherein the i-type semiconductor layer contains hydrogen atoms and/or halogen atoms.

51. A semiconductor device according to claim 50 wherein the content of the hydrogen atoms and/or halogen atoms is larger in the vicinity of interface between the i-type layer and the at least one doped layer.

52. A semiconductor device according to claim 38 wherein the at least one doped layer is amorphous.

53. A semiconductor device according to claim 38 wherein the at least doped layer is microcrystalline.

54. A semiconductor device according to claim 38 wherein the at least one doped layer is polycrystalline.

55. A semiconductor device according to claim 38 wherein the i-type semiconductor layer is amorphous.

56. A semiconductor device according to claim 38 wherein the i-type semiconductor layer is microcrystalline.

57. A semiconductor device according to claim 38 wherein the i-type semiconductor layer is polycrystalline.

58. A semiconductor device having a pin type semiconductor junction structure in which a p-type doped semiconductor layer and an n-type doped semiconductor layer are laminated with an interposed i-type semiconductor layer, comprising:
   at least one doped layer of non-monocrystal semiconductor disposed under and/or over the i-type semiconductor layer; and
   a buffer layer disposed between the i-type semiconductor layer and the at least one doped layer, wherein the buffer layer has a surface exposed to a plasma containing a band gap increasing element.

59. A semiconductor device according to claim 58 wherein the band gap increasing element is selected from the group consisting of carbon, nitrogen, and oxygen.

60. A semiconductor device according to claim 58 wherein the doped layer located at the light receiving surface side is p-type.

61. A semiconductor device according to claim 58 wherein the doped layer located at the light receiving surface side is n-type.

62. A semiconductor device according to claim 58 wherein a plurality of the pin junctions are tandem stacked.

63. A semiconductor device according to claim 58 wherein two of the pin junctions are tandem stacked.

64. A semiconductor device according to claim 58 wherein three of the pin junctions are tandem stacked.

65. A semiconductor device according to claim 58 wherein the amount of the band gap increasing element contained in the buffer layer varies in the layer thickness direction.

66. A semiconductor device according to claim 58 wherein the buffer layer is partly microcrystallized or polycrystallized in the layer thickness direction.

67. A semiconductor device according to claim 58 wherein the i-type semiconductor layer contains hydrogen atoms and/or halogen atoms.

68. A semiconductor device according to claim 67 wherein the content of the hydrogen atoms and/or halogen atoms is larger in the vicinity of the interface between the i-type semiconductor layer and the at least one doped layer.

69. A semiconductor device according to claim 58 wherein the at least one doped layer is amorphous.

70. A semiconductor device according to claim 58 wherein the at least one doped layer is microcrystalline.

71. A semiconductor device according to claim 58 wherein the at least one doped layer is polycrystalline.

72. A semiconductor device according to claim 58 wherein the i-type semiconductor layer is amorphous.

73. A semiconductor device according to claim 58 wherein the i-type semiconductor layer is microcrystalline.

74. A semiconductor device according to claim 58 wherein the i-type semiconductor layer is polycrystalline.

75. A photovoltaic device comprising at least three tandem stacked structures each comprising a pin type semiconductor junction in which an n-type doped semiconductor layer, an i-type semiconductor layer, and a p-type doped semiconductor layer are laminated, each of the semiconductor layers being non-monocrystal, and the n-type doped semiconductor layer and/or the p-type doped semiconductor layer having a surface exposed to a plasma containing a band gap increasing element.

76. A photovoltaic device according to claim 75 wherein the band gap increasing element is selected from the group consisting of carbon, nitrogen, and oxygen.

77. A photovoltaic device according to claim 75 wherein the plasma further contains a valence electron control agent.

78. A photovoltaic device according to claim 77 wherein the valence electron control agent comprises a group III element.

79. A photovoltaic device according to claim 77 wherein the valence electron control agent comprises a group V element.

80. A photovoltaic device according to claim 75 wherein each doped layer located at the light receiving side is p-type.

81. A photovoltaic device according to claim 75 wherein each doped layer located at the light receiving side is n-type.

82. A photovoltaic device according to claim 75 wherein the amount of the band gap increasing element contained in the at least one doped layer varies in the layer thickness direction.

83. A photovoltaic device according to claim 75 wherein the at least one doped layer is partly microcrystallized or polycrystallized in the layer thickness direction.

84. A photovoltaic device according to claim 75 wherein the i-type semiconductor layer contains hydrogen atoms and/or halogen atoms.

85. A photovoltaic device according to claim 84 wherein the content of the hydrogen atoms and/or halogen atoms is larger in the vicinity of interface between the i-type semiconductor layer and the at least one doped layer.

86. A photovoltaic device according to claim 75 wherein the at least one doped layer is amorphous.

87. A photovoltaic device according to claim 75 wherein the at least one doped layer is microcrystalline.

88. A photovoltaic device according to claim 75 wherein the at least one doped layer is polycrystalline.

89. A photovoltaic device according to claim 75 wherein the i-type semiconductor layer is amorphous.

90. A photovoltaic device according to claim 75 wherein the i-type semiconductor layer is microcrystalline.

91. A photovoltaic device according to claim 75 wherein the i-type semiconductor layer is polycrystalline.

92. A photovoltaic device according to claim 75 wherein a buffer layer is provided in one of said stacked structures between the n-type doped semiconductor layer and the i-type semiconductor layer and/or between the p-type semiconductor doped layer and the i-type semiconductor layer.

93. A photovoltaic device according to claim 92 wherein the buffer layer has a surface exposed to a plasma containing a band gap increasing element.

94. A photovoltaic device according to claim 93 wherein the band gap element is selected from the group consisting of carbon, nitrogen, and oxygen.

95. A method for manufacturing a photovoltaic device, comprising the sequential steps of:
   forming a first semiconductor layer of a first conductivity type on a substrate;
   exposing a surface of the first semiconductor layer of the first conductivity type to a plasma, said plasma containing a band gap increasing element;
   forming an i-type semiconductor layer on said exposed surface of the semiconductor layer of the first conductivity type; and
   forming a semiconductor layer of a second conductivity type, said type being opposite to the first conductivity type, on the i-type semiconductor layer.

96. A method for manufacturing a photovoltaic device according to claim 95 wherein the band gap increasing element is selected from the group consisting of carbon, nitrogen, and oxygen.

97. A method for manufacturing a photovoltaic device according to claim 95 wherein the plasma further contains a valence electron control agent.

98. A method for manufacturing a photovoltaic device according to claim 97 wherein the valence electron control agent comprises a group III element.

99. A method for manufacturing a photovoltaic device according to claim 97 wherein the valence electron control agent comprises a group V element.

100. A method for manufacturing a photovoltaic device according to claim 95 wherein the first conductivity type is n-type.

101. A method for manufacturing a photovoltaic device according to claim 95 wherein the first conductivity type is p-type.

102. A method for manufacturing a photovoltaic device according to claim 95 wherein the semiconductor layers of the first and second conductivity types are formed by the RF-CVD method.

103. A method for manufacturing a photovoltaic device according to claim 95 wherein the i-type semiconductor layer is formed by the microwave CVD method.

104. A method for manufacturing a photovoltaic device, comprising the sequential steps of:

forming a first semiconductor layer of a first conductivity type on a substrate;

forming an i-type semiconductor layer on said first semiconductor layer;

forming a semiconductor layer of a second conductivity type, said type being opposite to the first conductivity type, on the i-type semiconductor layer; and exposing a surface of the semiconductor layer of the second conductivity type to a plasma, said plasma containing a band gap increasing element.

105. A method for manufacturing a photovoltaic device according to claim 104 wherein the band gap increasing element is one selected from the group consisting of carbon, nitrogen, and oxygen.

106. A method for manufacturing a photovoltaic device according to claim 104 wherein the plasma further contains a valence electron control agent.

107. A method for manufacturing a photovoltaic device according to claim 106 wherein the valence electron control agent comprises a group III element.

108. A method for manufacturing a photovoltaic device according to claim 106 wherein the valence electron control agent comprises a group V element.

109. A method for manufacturing a photovoltaic device according to claim 104 wherein the first conductivity type is n-type.

110. A method for manufacturing a photovoltaic device according to claim 104 wherein the first conductivity type is p-type.

111. A method for manufacturing a photovoltaic device according to claim 104 wherein the semiconductor layers of the first and second conductivity types are formed by the RF-CVD method.

112. A method for manufacturing a photovoltaic device according to claim 104 wherein the i-type semiconductor layer is formed by the microwave CVD method.

113. A method for manufacturing a photovoltaic device, comprising the sequential steps of:

forming a first semiconductor layer of a first conductivity type on a substrate;

forming an i-type semiconductor layer on said first semiconductor layer;

forming a buffer layer on said i-type layer;

exposing a surface of the buffer layer to a plasma, said plasma containing a band gap increasing element; and forming a semiconductor layer of a second conductivity type, said type being opposite to the first conductivity type, on the plasma treated buffer layer.

114. A method for manufacturing a photovoltaic device according to claim 113 further comprising the step of exposing a surface of the semiconductor layer of the first and/or second conductive type to a plasma containing a band gap increasing element.

115. A method for manufacturing a photovoltaic device according to claim 113 wherein the band gap increasing element is selected from the group consisting of carbon, nitrogen, and oxygen.

116. A method for manufacturing a photovoltaic device according to claim 113 wherein the first conductivity type is n-type.

117. A method for manufacturing a photovoltaic device according to claim 113 wherein the first conductivity type is p-type.

118. A method for manufacturing a photovoltaic device according to claim 113 wherein the semiconductor layers of the first and second conductivity types are formed by the RF-CVD method.

119. A method for manufacturing a photovoltaic device according to claim 113 wherein the i-type semiconductor layer is formed by the microwave CVD method.

120. A method for manufacturing a photovoltaic device according to claim 113 wherein the buffer layer is formed by the RF-CVD method.

121. A method for manufacturing a photovoltaic device according to claim 113 wherein a second buffer layer, is further formed between the semiconductor layer of the first conductivity type and the i-type semiconductor layer.

122. A method for manufacturing a photovoltaic device according to claim 121 further comprising the step of exposing a surface of the second buffer layer to a plasma containing a band gap increasing element.

* * * * *

UNITED STATES PATENT AND TRADEMARK OFFICE
CERTIFICATE OF CORRECTION

PATENT NO. : 5,716,480
DATED : February 10, 1998
INVENTOR(S): JINSHO MATSUYAMA ET AL.   Page 1 of 3

It is certified that error appears in the above-identified patent and that said Letters Patent is hereby corrected as shown below:

COLUMN 5

Line 39, "microcrystalline" should read --microcrystallize--;

COLUMN 10

Line 54, "of to 50 nm," should read --of 1 to 50 nm,--.

COLUMN 13

Line 18, "increase" should read --increases--.

COLUMN 14

Line 10, "make" should read --makes--.

COLUMN 15

Line 21, "9low" should read --glow--.

COLUMN 16

Line 47, "a" should be deleted.

UNITED STATES PATENT AND TRADEMARK OFFICE
CERTIFICATE OF CORRECTION

PATENT NO. : 5,716,480

DATED : February 10, 1998

INVENTOR(S): JINSHO MATSUYAMA ET AL.

It is certified that error appears in the above-identified patent and that said Letters Patent is hereby corrected as shown below:

COLUMN 32
Line 59, "cheer" should read --chamber--;
Line 63, "cheer" should read --chamber--.

COLUMN 38
Line 16, "scam," should read --sccm,--.

COLUMN 44
Line 64, "Used" should read --used--.

COLUMN 46
Line 61, "scam," should read --sccm--.

COLUMN 48
Line 38, "Sih$_4$," should read --SiH$_4$,--;
Line 47, "cheer" should read --chamber--;

COLUMN 50
Line 4, "cheer" should read --chamber--.

COLUMN 54
Line 40, "cheer" should read --chamber--.

COLUMN 59
Line 5, "surface" should be deleted.

COLUMN 60
Line 31, "element" should read --increasing element--.

UNITED STATES PATENT AND TRADEMARK OFFICE
CERTIFICATE OF CORRECTION

PATENT NO. : 5,716,480

DATED : February 10, 1998

INVENTOR(S): JINSHO MATSUYAMA ET AL.

It is certified that error appears in the above-identified patent and that said Letters Patent is hereby corrected as shown below:

<u>COLUMN 61</u>
Line 20, "one" should be deleted.

<u>COLUMN 62</u>
Line 37, "layer," should read --layer--.

Signed and Sealed this

Eighteenth Day of August, 1998

Attest:

BRUCE LEHMAN

*Attesting Officer*    *Commissioner of Patents and Trademarks*